US009779191B1

(12) United States Patent
Hershey et al.

(10) Patent No.: US 9,779,191 B1
(45) Date of Patent: Oct. 3, 2017

(54) METHOD FOR NON-KINETIC PERFORMANCE ASSESSMENT

(71) Applicant: Raytheon Company, Waltham, MA (US)

(72) Inventors: Paul C. Hershey, Ashburn, VA (US); Robert E. Dehnert, Jr., Fairfax Station, VA (US); John J. Williams, Manassas Park, VA (US); John N. Carbone, Garland, TX (US); Jeanne M. Robinson, Annandale, VA (US); David J. Wisniewski, Pa Furnace, PA (US)

(73) Assignee: Raytheon Company, Waltham, MA (US)

( * ) Notice: Subject to any disclaimer, the term of this patent is extended or adjusted under 35 U.S.C. 154(b) by 345 days.

(21) Appl. No.: 14/185,029

(22) Filed: Feb. 20, 2014

(51) Int. Cl.
*G06F 17/50* (2006.01)
*F41H 11/02* (2006.01)
*G06N 99/00* (2010.01)

(52) U.S. Cl.
CPC ......... *G06F 17/5036* (2013.01); *F41H 11/02* (2013.01); *G06N 99/00* (2013.01)

(58) Field of Classification Search
None
See application file for complete search history.

(56) References Cited

U.S. PATENT DOCUMENTS

2010/0332889 A1* 12/2010 Shneorson ............ G06Q 10/06
714/2

OTHER PUBLICATIONS

Brown, G., et al. "A two-sided optimization for theater ballistic missile defense." Operations research 53.5 (2005): 745-763.*
Mell, P., et al. "Common vulnerability scoring system." Security & Privacy, IEEE 4.6 (2006): 85-89.*
Garrett, R., et al. "Managing the interstitials, a system of systems framework suited for the ballistic missile defense system." Systems Engineering 14.1 (2011): 87-109.*

(Continued)

*Primary Examiner* — Kakali Chaki
*Assistant Examiner* — Eric Nilsson
(74) *Attorney, Agent, or Firm* — Schwegman Lundberg & Woessner, P.A.

(57) ABSTRACT

Embodiments of an apparatus and method for assessing non-kinetic weapon performance for negating missile threats are generally described herein. In some embodiments, vulnerabilities of missile threats and techniques for negating the threats are identified. A probability of negation associated with an effectiveness of each of the techniques against the vulnerabilities is calculated. The calculated probability of negation of each technique against each vulnerability are conditioned at a plurality of times associated with a plurality of asymmetric missile defense (AMD) layer elements to produce temporal level probabilities of negation. Each temporal level probabilities of negation are conditioned based on a probability of validation of deployment and a probability of verification of mitigation to produce a battle damage assessment probability of negation. A terminal phase probability of impact failure without any intervention is calculated by combining the battle damage assessment probability of negation for each of plurality of AMD layers.

21 Claims, 12 Drawing Sheets

(56) References Cited

OTHER PUBLICATIONS

Paté-Cornell, E. "Fusion of intelligence information: A Bayesian approach." Risk Analysis 22.3 (2002): 445-454.*

Kopp, Carlo, et al., "High Energy Laser Directed Energy Weapons", © 2006-2012 Carlo Kopp, *Technical Report APA-TR-2008-0501, Defense Today, 2006 Series*, (May 2008), 39 pgs.

Mell. Peter, et al., "CVSS, A Complete Guide to the Common Vulnerability Scoring System", *Version 2.0 National Institute of Standards and Technology*, Carnegie Mellon University, (Jun. 2007), 1-23.

Shein, Rob, "A Brief Summary of Cyber Warfare", *Information Security Management Handbook, Sixth Edition*, vol. 4, Tipton, H. F., et al., Editors, Auerbach Publications, (2010), 6 pgs.

\* cited by examiner

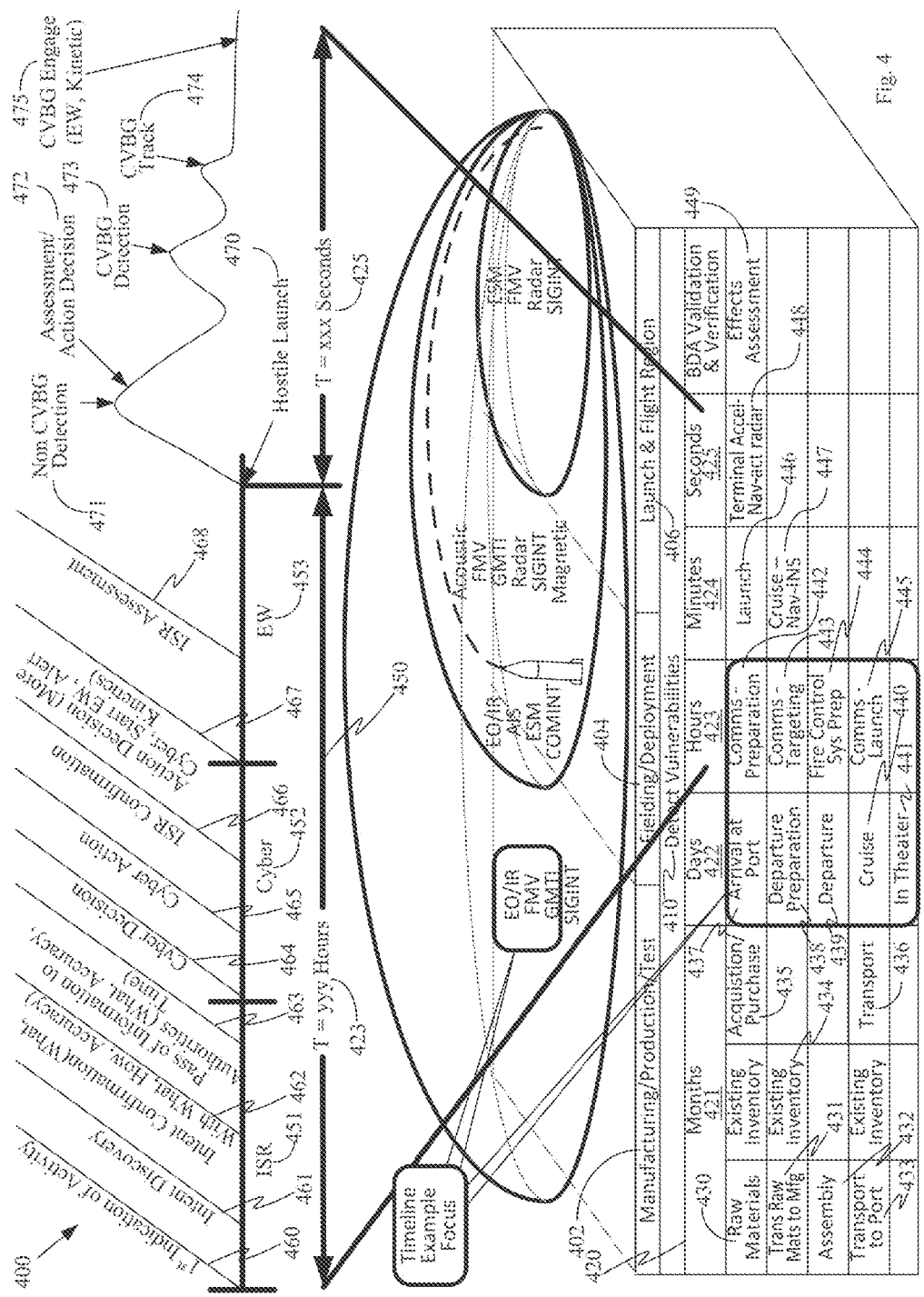

Math Tool 4 Computation Levels $$P_n(VT) = P_e \times P_d$$

| | Vulnerability 510 | | Technique 540 | | Levels 590 |
|---|---|---|---|---|---|
| | P(e) 520 | P(sv) 530 | P(p) 550 | P(d) 560 P(a) 561 | |
| | Very Unlikely 522 | Destroy 531 532 | Very Achievable 551 | Very Achievable | 0.9 |
| | Likely | Disrupt 533 | Achievable 553 | Achievable 563 | 0.7 |
| | Neutral | Deny | Neutral 552 | Neutral 562 | 0.5 |
| | Unlikely 523 | Degrade (Deter) 534 | Likely Unachievable 554 | Likely Unachievable 564 | 0.3 |
| | Very Unlikely 525 | Deceive 535 | Very Likely Unachievable 555 | Very Likely Unachievable 565 | 0.1 |

Computational Level 1: Basic Factors Level 521 — $P_n$ for each Vulnerability and Technique (VT) Pair is calculated (Initial Data Input Level) 580

Computation Level 1

Basic Factors Level (Initial Data Input Level for $P_n(VT)$)
For each Vul/Technique Intersection (VT), $P_n$ (Probability of negation) is calculated by multiplying $P_e$ (Probability of effectiveness) - where $P_e$ is a combination of vul. $P_{su}$ (Probability of success) & $P_{sv}$ (Probability of severity) - & $P_d$ (Probability of deployment) - where $P_d$ is a combination of techniques $P_p$ (Probability of placement) & $P_a$ (Probability of activation) - for that VT. The values of $P_d$ & $P_e$ are determined by combination of actual data & of information from Subject Matter Experts via rule-based value derivation process (e.g. (FMEA)).

Fig. 5

| | Manufacturing | | | Deployment | | | | | | | | | | Launch | | | | | | | In Flight | | |
|---|---|---|---|---|---|---|---|---|---|---|---|---|---|---|---|---|---|---|---|---|---|---|---|
| | | | | Facility | | | Vehicle | | | Tools | | | Personnel | | Comms | | | C2 SCADA | | Uplink | | Guidance | | Vehicle |
| Threat #1 | $V_A$ | $V_B$ | $V_C$ | $V_D$ | $V_E$ | $V_F$ | $V_G$ | $V_H$ | $V_I$ | $V_J$ | $V_K$ | $V_L$ | $V_M$ | $V_N$ | $V_O$ | $V_P$ | $V_Q$ | $V_R$ | $V_S$ | $V_T$ | $V_U$ | $V_V$ | $V_W$ |
| Non-Kinetic (Cyber Effects) | | | | | | | | | | | | | | | | | | | | | | | |
| Technique 1 | 0.9 | | 0.9 | | | | | | | | | | | 0.4 | 0.5 | | | | 0.9 | | | | |
| Technique 2 | 0.6 | 0.6 | | | | | | | | | | | | | | | | | | | | | |
| Technique 3 | 0.2 | | | | | | 0.4 | | | | | | | | | | | | | | | | |
| Technique 4 | | | | 0.7 | 0.7 | 0.3 | | | | | 0.1 | | | | | | | | | | | | |
| Technique 5 | | | 0.3 | 0.2 | 0.6 | 0.1 | | | | | | 0.7 | | | | | | | | | | | |
| Technique 6 | | | 0.2 | | | | | | | | | 0.8 | | | | | | | | | | | |
| Directed Energy | | | | | | | | | | | | | | | | | | | | | | | |
| EMP Technique 1 | | | | | | | | | | | | | | 0.8 | | | 0.6 | | | 0.5 | | | |
| EMP Technique 2 | | | | | | | | | | | | | | | | | | 0.6 | | 0.5 | 0.5 | 0.6 | |
| Microwave 1 | | | | | | | | | | | | | | | | | | | 0.8 | 0.7 | | 0.7 | |
| Microwave 2 | | | | | | | | | | | | | | 0.6 | | | | | | 0.4 | | | 0.4 |
| DE Technique n | | | | | | | | | | | | | | | | | | | | 0.7 | | | |
| Kinetic | | | | | | | | | | | | | | | | | | | | | | | |
| Weapon A (JDAM) | 0.7 | | | | | 0.6 | | | 0.9 | 0.9 | | | | | | | | | | | | | |
| Weapon A (Interceptor) | | | | | | | | | | | | | | | | | | | | | | | 0.9 |
| Technique Count | 3 | 1 | 3 | 2 | 2 | 2 | 1 | 0 | 1 | 0 | 1 | 2 | 0 | 2 | 1 | 0 | 1 | 1 | 3 | 4 | 2 | 2 | 1 |

Fig. 6

| Computational Level 3: Battle Damage Assessment (BDA) Level — $P_n(VTT_i)$ value is conditioned based on additional factors related to assessment of the potential success of the technique: Probability of validation of deployment ($P_{vd}$) and Probability of verification of mitigation ($P_{vm}$) | $P_n(VTT_i / BDA) = P_n(VTT_i / P_{vd}) \times P_n(VTT_i / P_{vm}) = P_n(VTT_i / P_{tip-d}) \times P_n(VTT_i / P_{vm})$ | | Battle Damage Assessment (BDA) Level — Each $P_n(VTT_i)$ value is further conditioned based on the following factors: $P_{vd}$ (Probability of validation of deployment) - which is equivalent to $P_{tip}$ and $P_{vm}$ (Probability of verification of mitigation) $P_n(VTT_i / BDA)$ is calculated using a basic Bayesian conditional calculation. |
|---|---|---|---|
| | where "Validation" is associated with "tipping", so $P_{vd}$ can be represented as $P_{tip-d}$ | | |
| | where $P_{tip}$ values are further decomposed into factors: $P_{occurrence}$ = Probability that Red Force indication of imminent action will occur $P_{available}$ = Probability that Blue Force ISR asset is available when Red Force indication occurs $P_{sense}$ = Probability that Blue Force ISR asset can detect Red Force indication $P_{time}$ = Probability that tip from Blue Force ISR is timely enough to enable BF tactical response $P_{tip}$ = Probability of successful tip from Blue Force asset | | |
| where $P_{vd} \equiv$ Probability of Validation of Deployment $P_{vm} \equiv$ Probability of Validation of Mitigation | | | |

Vulnerability Focus Points by Phase → 1010

Pfp(E) = Pocc(E) x Pavl(E) x Psen (E) x Ptim (E)
Pfp: Probability of successful tip from Blue Force asset
Poccurence = Probability that Red Force indication of imminent action will occur
Pavailable = Probability that Blue Force ISR asset is available when Red Force indication occurs
Psense = Probability that Blue Force ISR asset can detect Red Force indication
Ptime = Probability that tip from Blue Force ISR is timely enough to enable BF tactical response Phases: Platform Departure, Comms Preparation, Targeting

| Total # in PACOM Service 1012 | # of available For Scenario 1014 | System 1016 | Platform 1024 | Sensor 1044 | Pn(E) Manu, Prod, Test | Pn(D) Fielding, Deployment | Pocc Calculated Probability Based Historical Data, e.g. Weapons Loaded, Port 2, Land Comms | Pav | Psen Day | Night | Clouds | Clear spectrum | Noisy spectrum | Encrypted spectrum | Ptim (hrs) | Air Breathing Sensor Tipping Availability | Pn(C) Boost Phase | Pn(B) MID Boost | Pn(A) Terminal | Battle Damage Assessment |
|---|---|---|---|---|---|---|---|---|---|---|---|---|---|---|---|---|---|---|---|---|
| 33 | 3 | AF DCGS 1020 | 1050 1052 1054 1056 U2 1030 | EO | X | X | 0.3 | 0.9 | 0.9 | 0.9 | 0.9 | 0.9 | 0.9 | 0.9 | 0.9 | 17 | | | | X |
| | | | | IR | X | X | 0.3 | 0.9 | 0.9 | 0.9 | 0.9 | 0.9 | 0.9 | 0.9 | 0.9 | 17 | | | | X |
| | | | | SYERS(2) | X | X | 0.3 | 0.9 | 0.9 | 0.9 | 0.9 | 0.9 | 0.9 | 0.9 | 0.9 | 17 | X | | | X |
| | | | | ACES | X | X | 0.3 | 0.9 | 0.9 | 0.9 | 0.9 | 0.9 | 0.9 | 0.9 | 0.9 | 17 | | | | X |
| 3 | 3 | | 1058 GH Blks 1032 | GMTI | X | X | 0.3 | 0.9 | 0.9 | 0.9 | 0.9 | 0.9 | 0.9 | 0.9 | 0.9 | 17 | | | | X |
| | | | | EO | X | X | 0.3 | 0.9 | 0.9 | 0.9 | 0.9 | 0.9 | 0.9 | 0.9 | 0.9 | 24 | X | | | X |
| | | | | IR | X | X | 0.3 | 0.9 | 0.9 | 0.9 | 0.9 | 0.9 | 0.9 | 0.9 | 0.9 | 24 | | | | X |
| | | | | GMTI | X | X | 0.3 | 0.9 | 0.9 | 0.9 | 0.9 | 0.9 | 0.9 | 0.9 | 0.9 | 24 | | | | X |
| 13 | 3 | 1068 | 1060 1062 P3 1034 1064 1066 | FMV | X | X | 0.3 | 0.9 | 0.9 | 0.9 | 0.9 | 0.9 | 0.9 | 0.9 | 0.9 | 3 | X | X | X | X |
| | | | | GMTI | X | X | 0.3 | 0.9 | 0.9 | 0.9 | 0.9 | 0.9 | 0.9 | 0.9 | 0.9 | 3 | | | | X |
| | | | | COMINT | X | X | 0.3 | 0.9 | 0.9 | 0.9 | 0.9 | 0.9 | 0.9 | 0.9 | 0.9 | 3 | X | X | X | X |
| | | | | Acoustic | X | X | 0.3 | 0.9 | 0.9 | 0.9 | 0.9 | 0.9 | 0.9 | 0.9 | 0.9 | 3 | | | | |
| | | | | Magnetometer | X | X | 0.3 | 0.9 | 0.9 | 0.9 | 0.9 | 0.9 | 0.9 | 0.9 | 0.9 | 3 | | | | |
| 27 | 2 | Navy CANES/DCGS-N 1022 | Firescout 1036 | EO | X | X | 0.3 | 0.9 | 0.9 | 0.9 | 0.9 | 0.9 | 0.9 | 0.9 | 0.9 | 8 | X | X | X | X |
| | | | | IR | X | X | 0.3 | 0.9 | 0.9 | 0.9 | 0.9 | 0.9 | 0.9 | 0.9 | 0.9 | 8 | | | | X |
| | | | | FMV | X | X | 0.3 | 0.9 | 0.9 | 0.9 | 0.9 | 0.9 | 0.9 | 0.9 | 0.9 | 8 | | | | X |
| 56 | 56 | | F18 1038 | Radar Mine Tcktg | X | X | 0.3 | 0.9 | 0.9 | 0.9 | 0.9 | 0.9 | 0.9 | 0.9 | 0.9 | 2 | | | | |
| 8 | 8 | 1042 | AEGIS 1040 | Radar w/Overhead | X | X | 0.3 | 0.9 | 0.9 | 0.9 | 0.9 | 0.9 | 0.9 | 0.9 | 0.9 | Untld | X | X | X | X |
| 4 | 4 | | SSN 1070 USA 1072 | Sonar | X | X | 0.3 | 0.9 | 0.9 | 0.9 | 0.9 | 0.9 | 0.9 | 0.9 | 0.9 | Untld | X | X | X | X |

| Computational Level 4: Terminal Phase Level – Pn for the Terminal Phase is calculated by combining the Pn values related to each AMD Layer | $P_n(A)$ is the probability of impact failure during the terminal phase, without any intervention; Using Bayes Rule we can modify that estimate based on the following conditions (BCDE). ⟵ 1110<br><br>e.g., if $P_n(A) = 0.01$ (1% probability missile impact fails if we do nothing) then as we affect the various phases BCDE with exploitable non-kinetic vulnerability techniques, we expect $P_n(A)$ to increase<br><br>$P_n(A|BCDE) = P_n(ABCDE)/P_n(BCDE)$<br><br>using factorization and putting "always conditioned-on" events behind the conditioning bar for every expression used we can compute<br>$P_n(A|BCDE) = [P_n(BCDE|A) * P_n(A)]/P_n(BCDE)$ |
|---|---|
| Computation Level 4 | Terminal Phase Level<br>The $P_n(A)$ (Probability of Impact Failure during the Terminal Phase) is calculated by combining the $P_n(X)$ values of each individual phase.<br><br>$P_n(A)$ is calculated using a Bayesian conditional calculation:<br><br>$P_n(A|BCDE) = \dfrac{P_n(BCDE|A) * P_n(A)}{P_n(BCDE)}$ ⟵ 1120 |

Fig. 11

METHOD FOR NON-KINETIC PERFORMANCE ASSESSMENT

BACKGROUND

Continued proliferation of long range missiles and the fielding of sophisticated threats, such as the maneuvering re-entry vehicle, pose challenges for the fielded Ballistic Missile Defense System (BMDS) weapon systems. However, as missile defense has evolved from World War II to the present day, the advent of the digital age and the emergence of a wide variety of non-kinetic techniques create Asymmetric opportunities to augment the BMDS to assist in negation of ballistic missile threats and to rapidly inject Intelligence Surveillance and Reconnaissance (ISR) actionable decision aids into the often stressful offensive and defensive battle operations.

Kinetic techniques involve projectile weapons (e.g., such as guns, missiles and bombs) destroy targets by kinetic effects (e.g., overpressure, projectile, shrapnel and spalling damage, and incendiary effects). Kinetic weapons use stored chemical energy in propellants and warhead explosives and deliver this energy to a target by means of a projectile of some kind.

Non-kinetic techniques involve nonlethal weapons that do not induce direct physical harm to people. Examples: cyber, directed energy (DE), analogue-to-digital (A-to-D), electronic warfare (EW), decoys. Cyber weapons are delivered digitally. DE weapons deliver a large amount of stored energy from the weapon to the target, to produce structural and incendiary damage effects.

Over the last three years, over 50 trans-Atlantic companies participated in the North Atlantic Treaty Organization (NATO) Industry Advisory Group (NIAG) missile defense study. The purpose of the study was to identify anticipated missile defense capabilities from 2020 to 2030. In other words, the focus of the NATO study is a continuation of kinetic solutions which already struggle with raid size and sophistication. In effect, what the 50 trans-Atlantic NATO companies are saying is the best that industry can their offer their democracies through 2030 is to wait for the threats to launch before acting.

Currently, there are analytical solutions to provide performance assessment of these kinetic solutions. For example, Probability of Single Shot Engagement Kill, PSSEK, which is a measure the effectiveness used in these analytical approaches, is derived considering only kinetic means to neutralize the ballistic missile threat. PSSEK factors in the reliability of the combat system, the reliability of the interceptor, and the ability of the interceptor to intercept the Re-entry Vehicle (RV) of the missile. PSSEK expresses the reliability of the combat system operating correctly ($P_{es}$ and $P_{cs}$), and the probability of the interceptor neutralizing the threat (PSSK). PSSEK is defined as:

$$P_{SSEK}=P_{es}*(P_{cs}*)P_{rel}*P_{CTS}*P_{FOV}*P_{div}=P_{es}*(P_{cs}*)*P_{SSK}, \text{ where}$$

$P_{es}$ is the probability that the Combat System engagement support services operate correctly which involves probability of detection and track, probability of threat engagement, probability of target designation, and probability of engagement reliability. $P_{cs}$ is the reliability of the Combat System communication support services operating. $P_{rel}$ is the reliability of the interceptor and kill vehicle, which involves the probability of missile reliability and the probability of kill vehicle (KV) reliability. $P_{cts}$ is the probability of correct target selection, depending on targeting logic and on-board target selection logic. $P_{contain}$ is the probability of the interceptor will be able to contain a threat given the engagement support=PFOV*$P_{div}$; wherein PFOV is the probability of field of view containment and $P_{div}$ is the probability of divert containment.

However, these current methods for calculating engagement success are notional at best and inaccurate. In addition, the current methods for calculating engagement success promote complex solutions with silver bullet interceptors but low system reliability. New and more comprehensive ways to support operations are needed.

As an example, a system of systems approach rather than just focused enhancements to the combat system, the sensor performance, or the interceptor. This type of comprehensive approach can better support operations to make more informed decisions and to improve overall missile defense. Performance can't be rolled up into a single number. Thus, current methods are not available to assess system of systems performances.

In addition to probabilistic approach to characterizing PSSEK, there have been also been scoring systems developed to assess vulnerabilities of kinetic weapons (e.g. missiles). These systems prioritize vulnerabilities and identify those that pose the greatest risk. One such scoring system is the Common Vulnerability Scoring System (CVSS) that provides an open framework within which to score vulnerabilities. CVSS provides standardized vulnerability scores. When an organization normalizes vulnerability scores across its software and hardware platforms, it can leverage a vulnerability management policy. This policy may be similar to a service level agreement (SLA) that states how quickly a particular vulnerability must be validated and remediated.

CVSS also provides an open framework. Users can be confused when a vulnerability is assigned an arbitrary score. For example, which properties gave it that score, how does it differ from the one released yesterday, etc. With CVSS, anyone can see the individual characteristics used to derive a score.

CVSS provides prioritized risk such that when the environmental score is computed, the vulnerability becomes contextual. That is, vulnerability scores are now representative of the actual risk to an organization. Users know how important a given vulnerability is in relation to other vulnerabilities. However, CVSS does not provide a method by which to convert these scores into probability distributions. Additionally, because of shrinking economic resources available to the United States (US) and its allies in the foreseeable future, the traditional kinetic-only methods of missile defense need to be reassessed to provide for a broader, more holistic, and achievable approach to missile defense.

BRIEF DESCRIPTION OF THE DRAWINGS

FIG. 4 illustrates a threat analysis time line correlated with asymmetric layered framework according to an embodiment;

FIG. 5 illustrates a scoring system for the probability of effectiveness, $P_e$, and the probability of deployment, $P_d$, according to an embodiment;

FIG. 6 shows a notional example for Computational Level 1 according to an embodiment;

FIG. 9 illustrates the computational level 3 assessment according to an embodiment;

FIG. 10 shows the math tool matrix extension for Computational Level 3 compiled for examples for various platforms and sensors according to an embodiment;

FIG. 11 illustrates the computational level 4 assessment according to an embodiment.

DETAILED DESCRIPTION

Embodiments described herein provide a mathematical method, and associated algorithms, to assess, in automated fashion, the performance of non-kinetic techniques with respect to negating missile threats. According to an embodiment, a method for non-kinetic performance assessment is realized within a layered Asymmetric Missile Defense (AMD) system integrating cyber (offense and defense) technologies, ISR asset knowledge, Processing Exploitation and Dissemination (PED) techniques, legacy and emerging advanced analytics, as well as, Electronic Warfare (EW) capabilities. Other proven techniques, such as decoys and battle management (kinetic and non-kinetic) capabilities capable of negating missile threats (not only in phases of flight, but also left of launch) will also be incorporated within the system. Moreover, embodiments described herein may be used to assess system of systems performances and operable states of the system of systems, and the likelihood of each state and corresponding performance translate performance into understandable metrics, such as raid negation.

Figure 1:
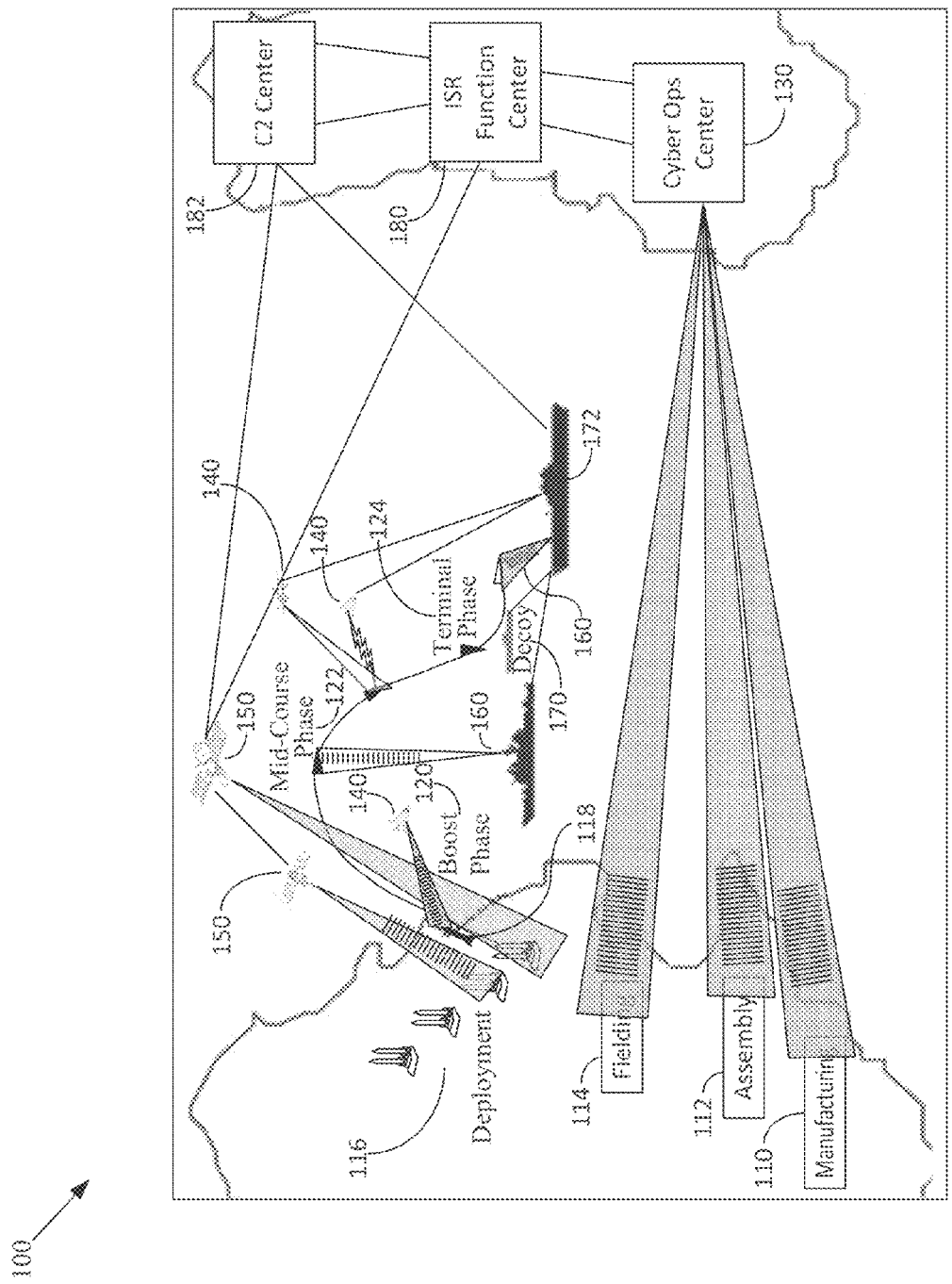
FIG. 1 illustrates a notional layered asymmetric missile defense (AMD) Operational View according to an embodiment.

FIG. 1 illustrates a notional layered AMD Operational View 100 according to an embodiment. In FIG. 1, manufacturing 110 and assembly 112 areas for producing missiles for consideration of threat profiling. Once manufacturing 110 and assembly 112 are completed, missiles are moved to a fielding area 114 where they are prepared for deployment areas 116. Once a missile 118 is launched, the missile 118 enters a boost phase 120 and then a mid-course phase 122. Next, the missile 118 enters a terminal phase 124 where the missile 118 attempts to disable or destroy a target. Various techniques may be used to negate a threat posed by the missile 118. Such techniques include effects that may be applied at different stages of the threat. For example, a cyber operations center 130 may be employed to achieve non-kinetic objectives, such as preparing the battlefield, attacking opposition networks and communications systems, and create effects on the systems associated with the threat. The techniques employed by the cyber operations center 130 may be directed against the manufacturing 110, assembly 112 and fielding 114 areas. However, deployment of these effects by the cyber operations center 130 is not limited to these areas. Additional assets, such as airborne jamming 140, satellite counter-measures 150, surface and sea electronic counter-measures 160, etc., may be brought against the threat during the boost phase 120, mid-course phase 122 and terminal phase 124. Further, a decoy payload 170 may be used to simulate a radar return from a large ship 172 overlapping the "target" signal. The decoy 170 provides a larger, more attractive target to the missile 118 consistent with the range and angle tracking of an anti-ship missile 118 and moves slowly away from the ship 172, thus defeating the threat. The combination of these techniques provides a layered anti-missile defense system to missile threats. Intelligence and surveillance data may be coordinated by an intelligence, surveillance and reconnaissance (ISR) function center 180. A command and control (C2) center 182 may be used to plan and to coordinate application of one or more of the techniques for mitigating or negating the threat.

According to an embodiment, a layered AMD system provides a probability of missile threat negation against many threats including large, complex raids and sophisticated multi-dimensional threats. Moreover, a method according to an embodiment provides a probability that a combination of non-kinetic and kinetic effects will be able to negate the threat posed by one or more missiles 118 launched against friendly targets, e.g., ship 172. Strategic and tactical planning endeavors are supported, as well as to guide decisions related to the deployment of both non-kinetic and kinetic weapons.

Figure 2:
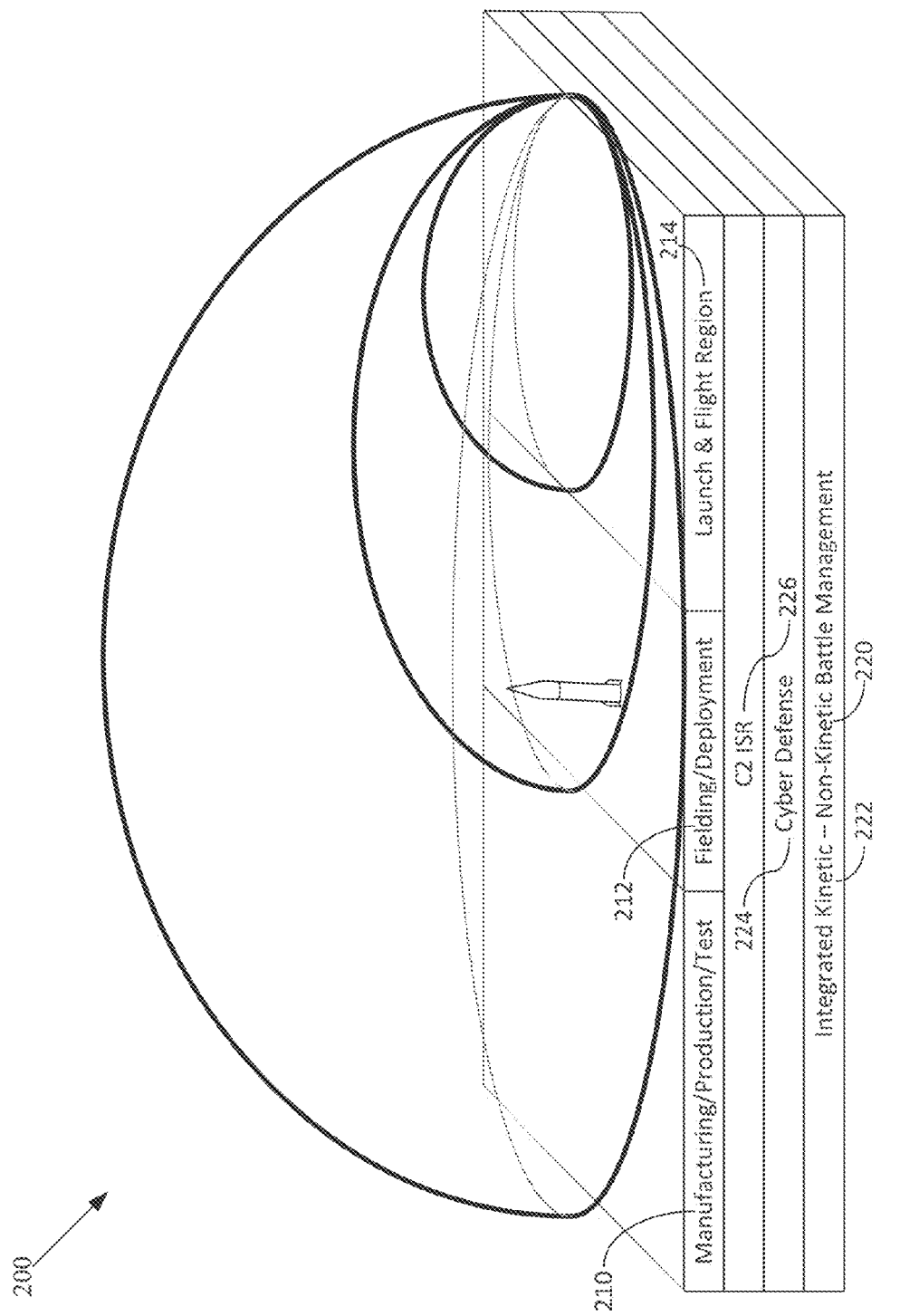
FIG. 2 illustrates the layered framework for non-kinetic missile defense assessment according to an embodiment.

FIG. 2 illustrates the layered framework 200 for non-kinetic missile defense assessment according to an embodiment. In FIG. 2, the manufacturing, production and test phase 210, the fielding and deployment phase 212, and the launch and flight phase 214 are illustrated. Non-kinetic techniques 220 may be used to complement kinetic techniques 222. For example, non-kinetic cyber defense techniques 224 may be used to prepare the battlefield, to attack opposition networks and communications systems, and to create effects on the systems associated with the threat. Command and control, intelligence, surveillance and reconnaissance (C2 ISR) measures 226 may be used to validate and verify the disruption of the launch of missile threats and the command and control for carrying out an attack.

For example, in the manufacturing, production and test phase 210 material defects that will propagate through the entire life cycle are induced early in the process. During fielding deployment phase 212, cyber measures 224 may be used to disrupt launch of missile threats and the command and control for carrying out an attack. C2 ISR measures 224 may then be used to validate and verify the initial and continuing success of the cyber measures 224. Material integrity may be degraded and failures during software and hardware upgrades may be induced. During the boost phase 214, techniques for disrupting and degrading material integrity, degrading communication uplinks, initiating self-destruct, disrupting guidance systems, etc. may be exploited. During the mid-course and terminal phases, techniques may also be used to disrupt and/or degrade material integrity, sensors, and guidance systems.

Figure 3:
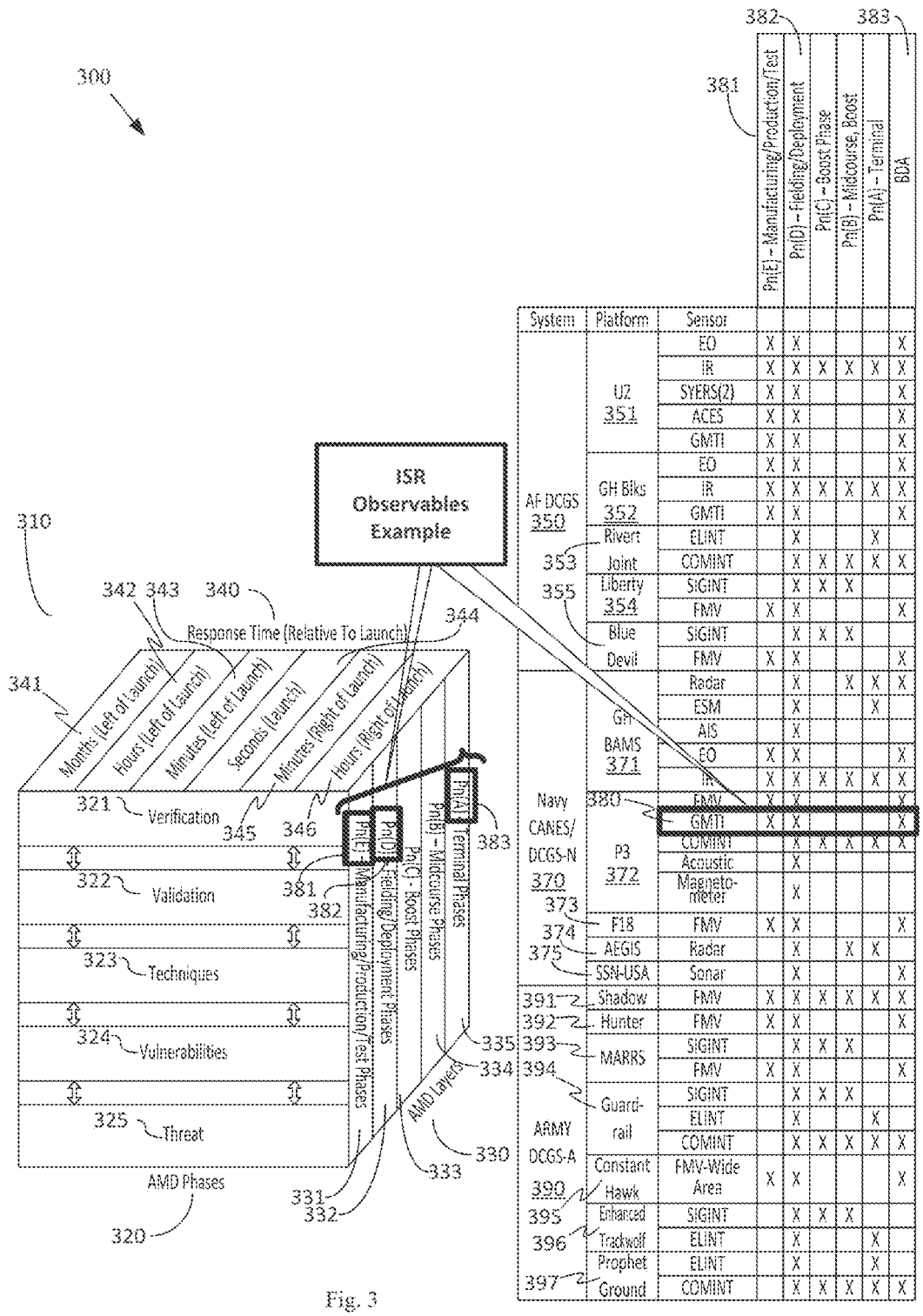
FIG. 3 illustrates mapping of intelligence, surveillance and reconnaissance-processing, exploitation, and dissemination (ISR-PED) sensors to the analysis framework according to an embodiment.

FIG. 3 illustrates mapping 300 of intelligence, surveillance and reconnaissance-processing, exploitation, and dissemination (ISR-PED) sensors to the analysis framework 300 according to an embodiment. The analysis framework 310 is a three-dimensional matrix of AMD phases 320, AMD layers 330 and the response time relative to launch 340. The AMD phases 320 include verification 321, validation 322, techniques 323, vulnerabilities 324 and threats 325. The AMD layers 330 include calculation of the probability of negation for the Manufacturer/Production/Test Phase 331, the Fielding/Deployment Phase 332, the Boost Phase 333, the Mid Course Phase 334 and the Terminal Phase 335. The response times relative to launch 340 include months left to (before) launch 341, hours left to launch 342, minutes left to launch 343, seconds to launch 344, minutes right of launch 345 and hours right of launch 346. The AMD layers have associated mathematical probabilities of success derived from the AMD mathematical tool (i.e., Math Tool). The AMD Layers 330 equate to the timing 340 of missile launch operations and include both left-of-launch and right-of-launch time elements.

In FIG. 3, three systems are shown, i.e., Air Force Distributed Common Ground System (AF DCGS) 350, Navy Consolidated Afloat Networks and Enterprise Services (CANES)/Distributed Common Ground System (DCGS) 370, and Army Distributed Common Ground System (DCGS) 390. The AF DCGS 350 is broken down into five platforms, i.e., U2 351, Global Hawk blocks (GH Blks) 352, Rivet Joint surveillance aircraft 353, the Liberty platform 354 and the Blue Devil sensor platform 355. Navy CANES/DCGS-N 370 is broken down further into GH BAMS 371, P-3 surveillance aircraft 372, F-18 Hornet aircraft 373, AEGIS 374 and SSN-USA attack submarine platforms 375. Army DCGS-A 390 is broken down into seven platforms, i.e., Shadow surveillance platform 391, Hunter airborne platform 392, Medium Altitude Reconnaissance and Surveillance Systems (MARSS) 393, Guardrail signals intelligence (SIGINT) collection and precision targeting location system 394, Constant Hawk persistent surveillance wide field of view Airborne Intelligence, Surveillance and Reconnaissance (AISR) system 395, Enhanced Trackwolf surveillance system 396 and Prophet ground platform 397. For each platform, associated sensors are shown and each sensor is indicated as being mapped to each of the AMD layers. For example, Ground Moving Target Indicator (GMTI) sensor 380 for the P3 platform 372 is mapped to a probability of negation for the Manufacturer/Production/Test Phase 381, a probability of negation for the Fielding/Deployment Phase 382 and the battle damage assessment (BDA) 383, which is the product of the probabilities of negations of applicable AMD layers.

FIG. 4 illustrates a threat analysis time line correlated with asymmetric layered framework 400 according to an embodiment. In FIG. 4, the manufacturing, production and test phase 402, the fielding and deployment phase 404, and the launch and flight phase 406 are illustrated. Vulnerabilities 410 are detected as shown relative to response times 420 associated with launch of a missile. For example, months before launch 421, vulnerabilities 410 may include raw materials 430, raw materials that are transformed into material to manufacturing 431, and assembly of components 432 and the transport of materials 433. Existing inventory of raw materials 434 and other components associated with different stages of manufacturing may be considered. Other vulnerabilities 410 during the manufacturing, production and test phase 402 may include the acquisition and purchase of materials 435 and the transport of materials 436. Days before launch 422, vulnerabilities 410 may include arrival of missile at the deployment area 437, departure preparation 438, the departure 439 and cruise 440 to the deployment area and deployment in the theater of operations 441. Hours before launch 423, vulnerabilities 410 may include communications preparation 442, targeting communications 443, fire control system preparation 444 and launch communications 445. In the minutes timeframe 424, vulnerabilities 410 may involve the launch 446 and the inertial navigation system (INS) 447.

During the seconds timeframe 425, vulnerabilities 410 include the terminal guidance system 448 which relies upon the acceleration data, active radar signals and other data (e.g., gyroscopic data, global positioning system data, etc.). Probabilities of negation for the layers are used to provide battle damage assessment validation and verification which provides assessment of the effects of the applied techniques 449.

The timeline 450 includes an hours before launch timeframe 423 and a seconds timeframe 425. During the hours timeframe 423, a section for ISR 451, cyber operations 452, and electronic warfare 453 are shown. The ISR 451 involves determination of the first indication of activity 460, discovery of the intent of the adversary 461, confirmation of the intent 462, and the passing of the information to authorities 463. The cyber operations 452 include arriving at a cyber decision 464, carrying out the cyber action 465, ISR confirmation 466 and subsequent action decisions 467, e.g., more cyber effects, start electronic warfare, alert kinetics, etc. The electronic warfare phase 453 begins by analysis of the ISR assessment 468.

After hostile launch 470, during the seconds timeframe 425, non-carrier battle group (CVBG) detection 471 may occur. Assessment and action decision 472, based on the non-CVBG detection, may be made. Next, the carrier battle group may detect the missile 473 and begin to track the missile 474. The carrier battle group may engage the missile using electronic warfare and kinetic weapons 475.

The AMD Math Tool may include four computational levels. Computational Level 1 is the basic factors level where a $P_{negation}$ ($P_n$) score is computed for each vulnerability and technique (VT) pair. Computational Level 2 coverts the VT sores into random variables, derives probability distribution functions for each random variable, and then conditions $P_n(VT)$ on Time (Ti). Thus, Computational Level 2 is consider the temporal level at which $P_n(VTTi)$ is calculated for each VT Pair. Computational Level 3 is the battle damage assessment (BDA) level where $P_n(VTTi)$ values are conditioned based on additional factors related to assessment of the potential success of the technique including the probability of validation of deployment ($P_{vd}$) and the probability of verification of mitigation ($P_{vin}$). The probability of validation of deployment ($P_{vd}$) may also be referred to as $P_{tip}$. Computational Level 4 is the terminal phase level wherein $P_n$ for the terminal phase is calculated by combining the $P_n$ values related to each of five AMD Layers.

FIG. 5 illustrates computational level 1 500 according to an embodiment. Computational level 1 500 provides a scoring system for the probability of effectiveness, $P_e$ 510, and the probability of deployment, $P_d$ 540, according to an embodiment. FIG. 5 shows that the probability of negation for each vulnerability and technique (VT) pair, $P_n(VT)$ 570, is the product of the probability of effectiveness, $P_e$, 510, and the probability of deployment, $P_d$ 540.

$P_e$ 510 is a combination of $P_{su}$ (Probability of success) 520 and $P_{sv}$ (Probability of severity) 530. $P_d$ (Probability of deployment) 540 is a combination of techniques $P_p$ (Probability of placement) 550 and $P_a$ (Probability of activation) 560 for that VT pair. The values of $P_e$ 510 and $P_d$ 540 are determined by combination of actual data and information from subject matter experts via rule-based value derivation process.

For each of $P_{su}$ 520, $P_{sv}$ 530, $P_p$ 550, and $P_a$ 560, a range of assessments 580 are given which relate to a corresponding range of scoring levels 590. For example, $P_{su}$ 520, i.e., the probability of success, may be assessed as being very likely 521, likely 522, neutral 523, unlikely 524 and very unlikely 525. $P_{sv}$ 530, i.e., the probability of severity, may be assessed as being destroy 531, disrupt 532, deny 533, degrade (deter) 534 and deceive 535. $P_p$ 550, i.e., the probability of placement, may be assessed as being very achievable 551, achievable 552, neutral 553, likely unachievable 554 and very likely unachievable 555. $P_a$ 560, i.e., the probability of activation, may be assessed as being very achievable 561, achievable 562, neutral 563, likely unachievable 564 and very likely unachievable 565. The scoring levels 590 are 0.9, 0.7, 0.5, 0.3 and 0.1.

Thus $P_n(VT)$ 570 is the probability of deterring an adversary from performing specific actions that directly related to the ability to detect opportunistic events from the farthest point left of launch, to the point leading up to the action and the ability to affect them, i.e., a score that ranks the negation with respect to the effectiveness of a specific technique against a specific vulnerability. Therefore, $P_n(VT)=P_e \times P_d$ OR $P_n(VT)=(P_{su} \times P_{sv}) \times (P_p \times P_a)$.

For example, if a specific technique would likely be successful when used against a specific vulnerability, and if that technique would destroy an adversary's capability if it was successful, and if the placement of that technique was likely unachievable, and if activation of the technique was very achievable if it was deployed then:

$$P_n(VT)=(P_{su} \times P_{sv}) \times (P_p \times P_a)=0.7 \times 0.9 \times 0.3 \times 0.9=0.1701.$$

FIG. 6 shows a notional example matrix 600 for Computational Level 1 according to an embodiment. The notional example for Computational Level 1 600 may be visualized as a matrix which is used to calculate the likelihood (expressed as a score) that a specific kinetic 610, directed energy 620 or non-kinetic 630 technique may be used to take advantage of one or more vulnerabilities 640 that exist in an adversary's technologies or operations. A "threat" can be characterized as a scenario in which one or more missiles intended to destroy a friendly target are launched from a specific location within an adversary's sphere of influence. For example, a specific threat may be the launch of a multi-missile attack launched by Enemy Nation #1 from Missile Launch Site XYZ and intended to destroy naval vessels of the United States or US Allies.

The X axis of the matrix 600 in FIG. 6 displays the vulnerabilities 640, identified during the vulnerability process phase that supports the scoring assignment values. These vulnerabilities relate to the operations, equipment, and facilities of the enemy threat. These vulnerabilities include weaknesses that occur within, or are introduced into, the missile life-cycle to include the layers mentioned previously: manufacturing/production/test phase 650, fielding/deployment phase 652, and missile launch phases, i.e., the launch phase 654 and in flight phase 656. These vulnerabilities 640 can be exploited through the techniques identified during the techniques process phase that also supports score value definition. These techniques take advantage of the specified vulnerabilities 640 to prevent the successful operation of the enemy threat. Each of the basic layers of the missile life-cycle is divided into sub-categories which provide more detail regarding the types of vulnerabilities that might be exploited.

For example, one of the subcategories of the fielding/deployment phase 652 is facility 660, which incorporates vulnerabilities related to the missile support and missile launch facilities which would typically be part of a missile deployment complex. The subcategories related to the launch phase include communications 661, which incorporates vulnerabilities related to potential disruption of communication channels used to facilitate missile launch, and also C2/SCADA (Command and Control, Supervisory Control and Data Acquisition) 662, which incorporates vulnerabilities related to disruption of the technologies which convey launch commands and other missile control information.

The Y axis of the matrix 600 displays the techniques 610, 620, 630 identified during the techniques process phase that may be used to exploit the various vulnerabilities and cause a partial or complete failure of the enemy missile threat, thus negating a successful missile attack. In this case, the term non-kinetic technique 630 includes techniques that are generally referred to as cyber weapons, i.e., techniques that are used to disrupt or destroy hardware and/or software components of a computerized system or network. An example of a non-kinetic technique would be a "Trojan horse" or "worm" that would be inserted into a computer system and exploit a known software vulnerability to cause the degradation of a missile control system. Directed energy techniques 620 include such things as a targeted Electromagnetic Pulse (EMP), which can disrupt electronic transmissions and communications signals. Kinetic 610 techniques involve application of destructive force derived from the kinetic energy of a projectile impacting at very high velocities. Examples include missiles, space deployed projectiles, railguns, etc. The cells 670 of the matrix 600 contain the probabilities of negation related to the effectiveness of a specific technique in exploiting a specific vulnerability 640.

Preliminary vulnerabilities in the manufacturing/production/test phase 650 involve vulnerabilities 640 associated with missile systems engineering and design. These are vulnerabilities 640 that may be introduced during the missile's development process, e.g., requirements, design, manufacturing specification, or other pre-implementation phase. Missile supply chain vulnerabilities are vulnerabilities 640 that may be exploited to cause a component of the missile to fail, degrade, or malfunction. These vulnerabilities 640 involve commercial off-the-shelf (COTS) materials or components acquired from a non-government source for inclusion within the missile. Vulnerabilities 640 in manufacturing may be exploited during the missile's manufacturing, i.e., assembly line, process. Facility vulnerabilities 660 are related to a facility within which the missile is stored, maintained, or launched that could cause disruption or degradation of a missile launch activity.

Other vulnerabilities 660 involve utilities and SCADA (Supervisory Control and Data Acquisition) systems. Acceptance test and quality control vulnerabilities may be introduced, but may remain undetected during the acceptance test and/or quality assurance processes. Operations and maintenance vulnerabilities may be introduced and cause damage or disruption to the missile or missile support components during the missile maintenance or operations phases. Communications and command and control (C2) vulnerabilities may be exploited to disrupt the communications and/or Command and Control (C2) systems which would support missile launch command transmissions. Missile flight vulnerabilities may be exploited following a missile launch to prevent a successful missile strike.

As mentioned above, the values of $P_d$ and $P_e$ are determined by a combination of actual data and solicitation of information from subject matter experts via a rule-based value derivation process. One such process is to use a failure mode and effect analysis (FMEA) structure. A failure mode is the way in which the component, subassembly, product, input, or process may fail to perform its intended function. Failure modes may be the result of upstream operations or may cause downstream operations to fail. In one embodiment, FMEA may involve eight vulnerability areas, including components, e.g., five components per vulnerability area, functions, operational modes, failure mode and cause, failure effects, severity and detection methods.

For example, the systems engineering design phase may involve a component such as flight control actuators/thrust vector controls (TVCs), which may include thrust vector control, jet vanes, ACS/RCS (attitude control system/reaction control system), control fins, etc. Functions may involve stabilizing and guiding flight in operational mode for ground test mode (not much load, not realistic) and/or flight (full flight loads). Failure mode and cause may consider in flight operation, e.g., obtain random results, overdrive or under drive actuators, jet vanes that lack thermal cooling, or situations where the failure cannot be simulated. Failure effect may involve a loss of control and the severity may involve a failure to hit a target. Detection methods may include tests with high loads required and detailed destructive inspection.

Table 1 below highlights a vulnerability area includes flight computer where code is compiled to machine code which has an overall ranking of 5.

TABLE 1

| Vulnerability Area | $P_e$ Number | Scale Rating | P Severity | P Deploy | Overall Ranking |
|---|---|---|---|---|---|
| Materials/propellants/thermal environment heat sink | 1 | 2 | 1 | 2 | 5 |
| Flight Computer - compiler to machine code | 2 | 1 | 2 | 2 | 5 |
| Flight Control Actuators/TVCs | 3 | 2 | 1 | 2 | 5 |
| Timing/Sequencing | 4 | 2 | 1 | 2 | 5 |
| Inertial sensors | 5 | 1 | 3 | 2 | 6 |
| RF Sensors | 6 | 3 | 1 | 2 | 6 |
| Counterfeit components (SCC) | 7 | 1 | 2 | 2 | 5 |

A supply chain component may focus on labels on lubricants, adhesives, and chemicals used in missile assembly process. Functions considered may involve labels used to identify item, the type, application process, and usage. The operational mode may be to mark missile components. A failure mode and cause may involve modifying the labels to misidentify the lubricant, adhesive, or chemical to ensure that an inappropriate item is used, e.g., an item that will cause deterioration of one or more missile components. The failure effect may be multiple, including the best effect where there is deterioration over time that would not be detected in the test or quality assurance process. The severity of the failure would result in a catastrophic event. Detection methods may include operation and maintenance procedures.

Table 2 highlights a vulnerability area being modifying order and labeling of components. In this case, the overall ranking would have a value of 9.

TABLE 2

| Vulnerability Area | $P_e$ Number | Scale Rating | P Severity | P Deploy | Overall Ranking |
|---|---|---|---|---|---|
| Modify TDP | 1 | 2 | 1 | 1 | 4 |
| Modify MRP | 2 | 2 | 4 | 1 | 7 |
| Attack on Personnel | 3 | 2 | 4 | 5 | 11 |
| Falsify GIDEP | 4 | 2 | 4 | 3 | 9 |
| Modify Planning Docs & Work Institutions | 5 | 2 | 1 | 1 | 4 |

TABLE 2-continued

| Vulnerability Area | $P_e$ Number | Scale Rating | P Severity | P Deploy | Overall Ranking |
|---|---|---|---|---|---|
| Disrupt Single Sources of Supply | 6 | 2 | 5 | 1 | 8 |
| Substitute Material - Reference SE no 6 | 7 | | | | 0 |
| Modify Order and Labeling | 8 | 2 | 5 | 2 | 9 |
| Insert Modifications in COTS - Reference to Flight | 9 | 2 | | | 2 |
| Modification of Polymer Materials | 10 | 2 | 2 | 3 | 10 |

In the manufacturing process, component failures may occur due to connection failures. Such failures may attribute to 80% of failures in harness connectivity. Connections provide electrical connectivity across sub-system wiring. The operational mode involves any time electrical power applied to wiring harness. The failure mode and cause involves electrical power and electronic signals failure and a reduced reliability in connectors (random). The failure effect may involve small failure that result in large amount of rework and negation opportunities. Examples may include super glue applied on connectors and/or supply chain interference. The severity is given a rank of 5. Detection methods include the physical testing of connectors.

Table 3 illustrates a vulnerability area as being connection failures. In Table 3, the overall ranking for connection failures is given an overall ranking of 12.

TABLE 3

| Vulnerability Area | $P_e$ Number | Scale Rating | P Severity | P Deploy | Overall Ranking |
|---|---|---|---|---|---|
| Installation of Sub Opt Comp | 1 | 2 | 4 | 2 | 8 |
| Damage Due to Materials | 2 | 1 | 2 | 3 | 7 |
| Connection Failures | 3 | 3 | 5 | 4 | 12 |
| CTE Diff in Materials | 4 | 4 | 2 | 4 | 10 |
| Secondary-Tert Supply | 5 | 4 | 2 | 2 | 8 |

Another failure in the manufacturing are may involve Schottky diodes, which are used to conducts electrical signals. The operational mode may be any time electrical power is applied to sub-systems. The failure mode and cause may involve contamination on silicon affecting barrier metal attachment. The failure effect involves degradation of diodes over time and thermal cycling until failures occur at ambient temperatures. Here the severity is given a ranking of 1 due to the loss of electronics before/after launch. Detection methods may include detection after significant thermal cycling.

Table 4 highlights the Schottky diode as being a vulnerability area. In Table 4, the vulnerability due to Schottky diode failure is given an overall rank of 6.

TABLE 4

| Vulnerability Area | Number | $P_e$ Scale Rating | P Severity | P Deploy | Overall Ranking |
|---|---|---|---|---|---|
| Battery—Powers Missile During Launch & Flight | 1 | 1 | 1 | 4 | 6 |
| Battery—Powers Missile During Launch & Flight | 2 | 1 | 1 | 3 | 5 |
| Schottky Diodes - Conducts Electrical Signals | 3 | 2 | 1 | 3 | 6 |
| Aluminum Bond Wires in ICs - Provides a Signal Path Internal to the IC | 4 | 2 | 3 | 2 | 7 |
| ICs With Cavities (Ceramic Packages) - Electrical Circuitry | 5 | 2 | 1 | 4 | 7 |
| Plastic ICs - Electrical Circuitry | 6 | 2 | 1 | 2 | 5 |
| Pyroswitches - Enables Launch Circuitry | 7 | 1 | 1 | 4 | 6 |
| Ball Grid Arrays - Electrical Circuitry | 8 | 1 | 2 | 2 | 5 |

An example of facility failure may involve an electric power generator for the missile storage/launch preparation facility. The electrical power generator enables lighting, utility support, i.e., water pumps, communications, etc. The operation mode involves 24-7 electric power generation. The failure mode and cause may include insertion of a cyber weapon into the software-based SCADA system that controls power generation to cause disruption or total failure of the power generation for the facility. The launch of such a cyber weapon may be timed to cause maximum effect. The failure effect may include no lights, no water, and no communications for the facility thereby resulting in delay of a missile launch. The severity may range from degradation to catastrophic failure. Detection methods may focus on operation and maintenance inspection of the power generator.

Table 5 highlights the failure of the electrical generator. In Table 5, the failure of the electrical generator is given an overall ranking of 8.

TABLE 5

| Vulnerability Area | Number | $P_e$ Scale Rating | P Severity | P Deploy | Overall Ranking |
|---|---|---|---|---|---|
| Config File For Elect Gen | 1 | 1 | 5 | 2 | 8 |
| Field Dist System on TEL | 2 | 4 | 4 | 3 | 11 |
| Rebar In Concrete | 3 | 5 | 3 | 2 | 10 |
| Authorization For Entry | 4 | 4 | 5 | 4 | 13 |
| Environmental Controls | 5 | 5 | 4 | 4 | 13 |
| Sprinkler System | 6 | 4 | 2 | 3 | 9 |

A failure in the acceptance test and quality control may include incorrect/counterfeit parts, whether electrical, mechanical or chemical. Such a vulnerability is given a probability of effectiveness (Pe) of 2. Examples may include the use of 100% tin plating, sub-standard parts, contaminated/expired chemicals, etc. This vulnerability may be present in various functions and involve various operation modes. The failure mode and cause may involve incorrect/counterfeit parts/spoof including contamination of "lots" of mil-specification or commercial-off-the-shelf (COTS) electrical/mechanical parts with incorrect/counterfeit parts. Contamination may be introduced into different chemicals or their shelf life information may be falsified. The effect of a failure in this area may result in a latent failure. The severity is given a ranking of 2-3. Detection methods may include the visual inspection/acceptance test/vibe/de-lid for cavity devices.

Table 6 highlights counterfeit parts as a vulnerability area. The counterfeit parts are given an overall ranking of 11.

TABLE 6

| Vulnerability Area | Number | $P_e$ Scale Rating | P Severity | P Deploy | Overall Ranking |
|---|---|---|---|---|---|
| Damaged Components | 1 | 1 | 5 | 2 | 8 |
| Counterfeit Parts | 2 | 4 | 4 | 3 | 11 |
| Bad Tooling | 3 | 5 | 3 | 2 | 10 |
| Inadequate PHST | 4 | 4 | 5 | 4 | 13 |
| Test Specs & Procedures | 5 | 5 | 4 | 4 | 13 |

Other failure mode and effect analysis (FMEA) may be used. The above examples are present merely as examples for the understanding of the process.

Figure 7:
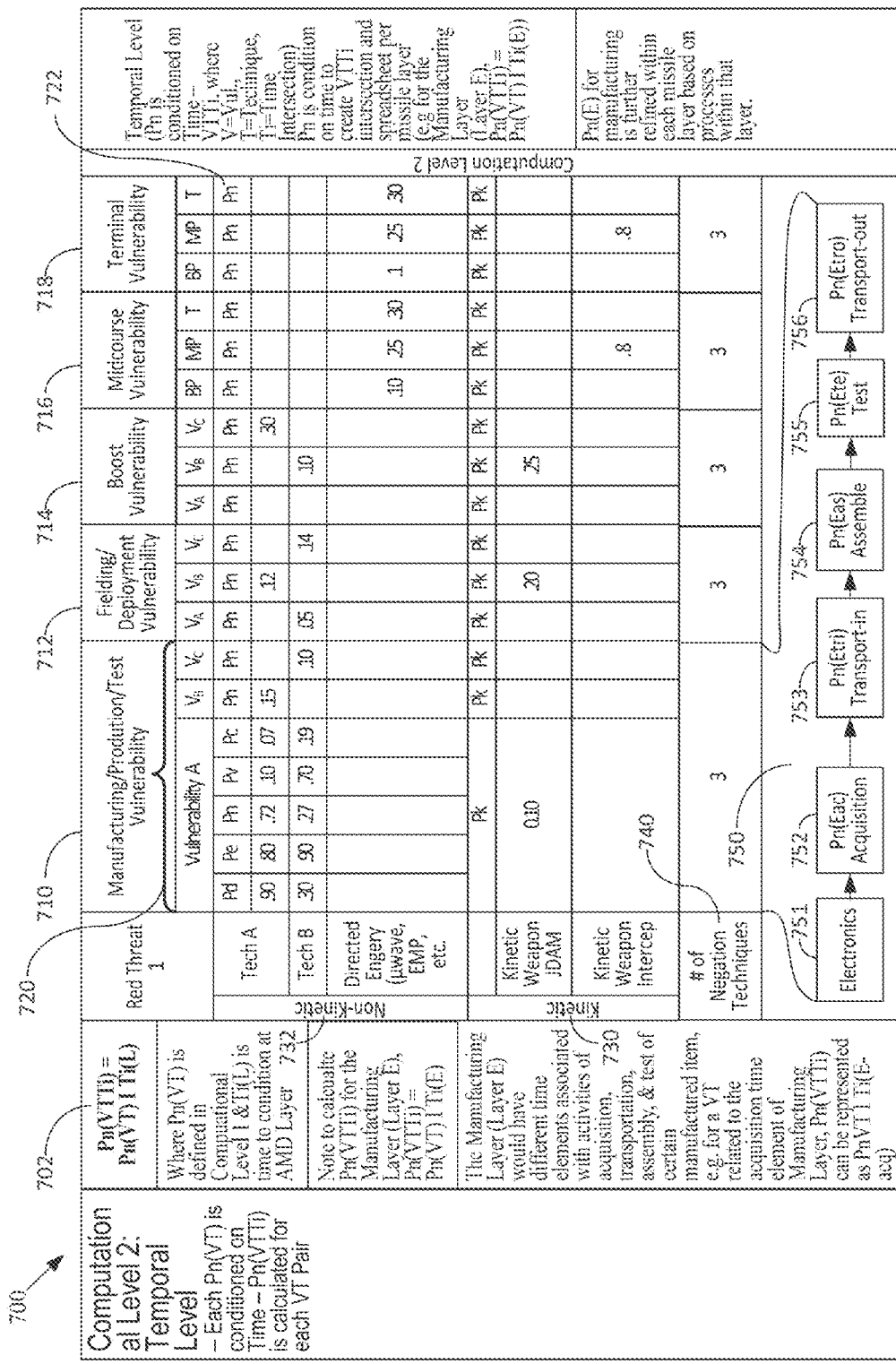
FIG. 7 illustrates a matrix for the probability of negation for the temporal level according to an embodiment.

FIG. 7 illustrates AMD Math Tool Computational Level 2, the temporal level, where a matrix 700 provides the probability of negation according to an embodiment. Each $P_n(VT)$ has been converted to a random variable for which a probability distribution function may be derived. Then each $P_n(VT)$ is conditioned on time to produce a $P_n(VTT_i)$ 702 for each VT Pair. Each AMD Layer, i.e., manufacturing 710, fielding 712, boost 714, midcourse 716, and terminal 718, incorporates a variety of time elements. Therefore, $P_n(VTT_i) = P_n(VT|T_i(L))$, where $P_n(VT)$ is defined in computational level 1 described above and Ti(L) is time on which to condition at AMD Layer L.

In FIG. 7, each AMD layer 710-718 is further divided into specific vulnerabilities 720 and a probability of negation 722 is assessed for each vulnerability 720 and technique pairing. Kinetic 730 and non-kinetic 732 techniques may be used to exploit the various vulnerabilities 720 and cause a partial or complete failure of the enemy missile threat. The number of negation techniques 740 is given for each AMD layer 710-718. FIG. 7 shows time elements 750 associated with the manufacturing, production, and test vulnerability 710. The time elements 750 associated with the manufacturing, production, and test vulnerability 710 for electronics 751 include acquisition 752, transport in of components 753, assembly of the components 754, test of the assembled electronics 755 and transport out 756. Thus, the manufacturing layer (Layer E) would have different time elements associated with the activities of acquisition, transportation, assembly, and test of a certain manufactured item. To calculate the $P_n$ for a $VTT_i$ related to Layer E, $P_n(VTT_i) = P_n(VT|T_i(E))$ where $P_n(VTTi)$ is the probability of negation of a specific technique used against a specific vulnerability at a certain time, $P_n(VT)$ is the value calculated via Computational Level 1, and $T_i(E)$ is the value associated with a certain time element within Layer E. For example, for a VT that would be related to the acquisition time element of the manufacturing layer, the $P_n(VTT_i)$ may be represented as $P_n(VT|T_iE_{acq})$. In a Bayesian conditional format, the $P_n(VT|T_iE_{acq})$ would be calculated as:

$$P_n(VT \mid T_i E_{acq}) = \frac{P_n(VT) \times P_n(T_i E_{acq} \mid VT)}{P_n(T_i E_{acq})}, \text{ where}$$

$P_n(T_i E_{acq})$ would be further calculated based on the $P_n$ values related to the list of manufacturing layer time elements.

A probability distribution function (pdf) may be derived for each scoring category from computation level 1. For the example of FIG. 6, each score is uniformly distributed between 0.1 and 0.9 in 5 equal intervals each separated by 02. Therefore the pdf is the Normal (i.e. Gaussian) distribution.

Confidence levels for each pdf are derived. For the example of FIG. 5, because each score is uniformly distributed between 0.1 and 0.9 in 5 equal intervals each separated by 02, then the confidence level is 0.2 for each scoring level. For destructions that are not distributed as in FIG. 5, we will derive confidence intervals through Monte Carlo simulations. The true probabilities for the temporal level may be computed for Computational Level 2.

Figure 8:
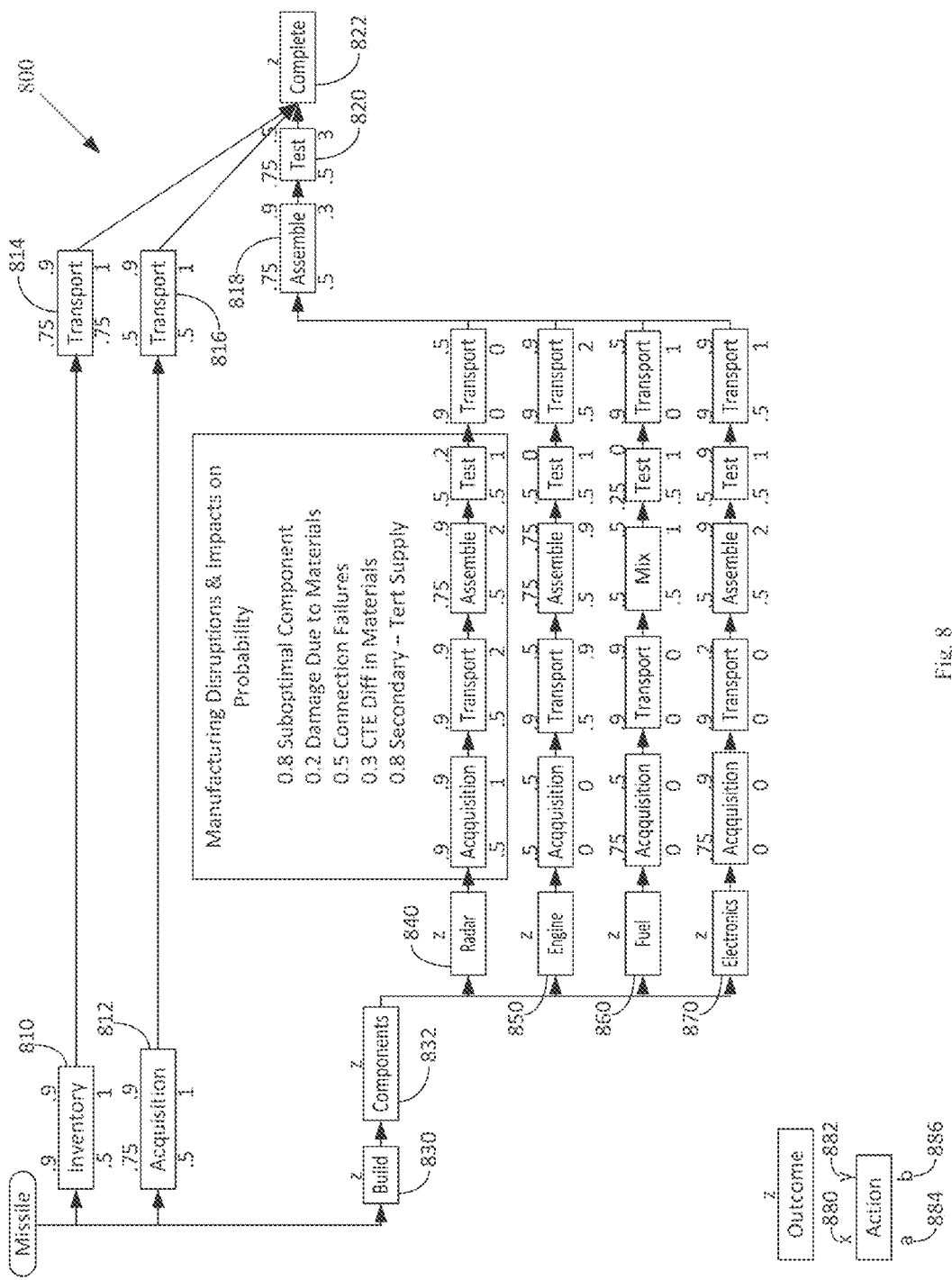
FIG. 8 illustrates time elements in AMD layers according to an embodiment.

FIG. 8 illustrates time elements in the AMD manufacturing sublayers 800 according to an embodiment. In FIG. 8, inventory 810 and acquisition 812 are provided in the timeline. Transport actions 814, 816 are associated with the inventory 810 and acquisition 812 where they are provided after the assembly 818 and test 820 actions prior to the completion outcome 822.

Build 830 and components 832 outcomes provide input to radar 840, engine 850, fuel 860 and electronics 870 outcomes. Each outcome, such as the build 830 and components 832, is based on Bayesian calculation utilizing action probabilities. Each action, such as transport 816, is associated with four values, i.e., x, y, a, b. The value for "x" 880 is associated with the subject probability of success of each action. The value for "y" 882 is associated with the ability to detect and/or ascertain success of interdiction. The value for "a" 884 is associated with the ability to interdict. The value for "b" 886 is associated with the effort and/or cost associated with interdiction.

FIG. 9 illustrates the computational level 3 assessment 900 according to an embodiment. In FIG. 9 the battle damage assessment probability of negation, $P_n(BDA)$, is computed. $P_n(BDA)$ is the probability of negation related to the assessment of the actual success of a specific technique against a specific vulnerability. To derive $P_n(BDA)$, each $P_n(VTT_i)$ 910 value is conditioned based on additional factors related to assessment of the potential success of the technique. These factors include $P_{vd}$ 920, which is the probability of validation of deployment and $P_{vm}$ 922, which is the probability of verification of mitigation.

Probability of validation of deployment $(P_{vd})$ 920 is the probability that the technique has actually been successfully deployed. $P_{vd}$ 920 is equivalent to $P_{tip}$ 924 because "tips" from tactical ISR assets, or other intelligence sources, may be used to validate this deployment. The probability of verification of mitigation $(P_{vm})$ 922 is the probability that the technique has been mitigated and is, therefore, no longer available for use as a viable technique. For example, if an adversary has located a non-kinetic weapon once it is put in place, the probability of mitigation is high. In another scenario, a non-kinetic weapon which is deployed in an adversary environment would likely lead the adversary to locate a similar weapon in other environments. $P_n(VTT_i|BDA)$ 940 may be calculated using a basic Bayesian conditional calculation:

$$P_n(VTT_i | P_{tip}) = \frac{P_n(VTT_i) * P_n(P_{tip} | VTT_i)}{P_n(P_{tip})}.$$

$P_n(VTT_i|BDA)$ 940 values are calculated by multiplying $P_n(VTT_i|P_{tip})$ by $P_{vm}$ 922.

For example, if an adversary has located a non-kinetic weapon once it is put in place, the probability of mitigation is high. In another scenario, a non-kinetic weapon which is deployed in an adversary environment would likely lead the adversary to locate a similar weapon in other environments.

Responses to questions drive the values associated with the $P_{tip}$ values, where $P_{OCCURRENCE}$ 950 is the probability that enemy indication of imminent action will occur (Q1, Q2, Q6), $P_{AVAILABLE}$ 952 is the probability that friendly ISR assets are available when enemy indication occurs (Q3, Q4), $P_{SENSE}$ 954 is the probability that friendly ISR assets may be able to detect enemy indication (Q5), $P_{TIME}$ 956 is the probability that tip from friendly ISR is timely enough to enable BF tactical response (Q7), $P_{tip}$ is the probability of successful tip from friendly ISR assets. Thus, $P_{tip}$ 924 may be computed according to:

$$P_{tip} = P_{OCCURRENCE} * P_{AVAILABLE} * P_{SENSE} * P_{TIME}$$

FIG. 10 shows the AMD Math Tool matrix extension 1000 for Computational Level 3 compiled for examples for various platforms and sensors according to an embodiment. In FIG. 10, vulnerability focus points are provided by phase 1010. An example is provided for the total number of vulnerability focus points in a Pacific Command (PACOM) 1012 hypothetical. The number available for a scenario 1014 is given. The systems 1016 shown in FIG. 10 includes Air Force Distributed Common Ground System (AF DCGS) 1020 and the Navy Consolidated Afloat Networks and Enterprise Services (CANES)/Distributed Common Ground System (DCGS) 1022. For the AF DCGS, the platforms 1024 include the U2 1030 and Global Hawk blocks (GH Blks) 1032. The Navy CANES/DCGS platforms include the P-3 surveillance aircraft 1034, the FireScout unmanned helicopter 1036, the F-18 Hornet aircraft 1038, the AEGIS missile defense system 1040 and the SSN-USA attack submarines 1042. Numerous sensors 1044 are illustrated including electro-optic (EO) sensors 1050, infrared (IR) sensors 1052, Senior Year Electro-Optical Reconnaissance Sensors (SYERS-2) 1054, Airborne Cueing and Exploitation System (ACES) 1056, Ground Moving Target Indicator (GMTI) 1058, Full Motion Video (FMV) sensors 1060, communications intelligence (COMINT) 1062, acoustic sensors 1064, magnetometers 1066, radar mine tracking sensors 1068, radar 1070 and sonar 1072.

For each of the sensors 1044 associated with the platforms 1024 and systems 1016, cells 1080 are provided for $P_n(E)$ Manufacturing, Production and Test 1081, $P_n(D)$ Fielding/Deployment 1082, Calculated Probability Based Historical Data (e.g. Weapons Loaded, Port 2 Land Comms) 1083, Day 1084, Night 1085, Clouds 1086, Clear spectrum 1087, Noisy spectrum 1088, Encrypted spectrum 1089, Air Breathing Sensor Tipping Availability 1090, $P_n(C)$ Boost Phase 1091, $P_n(B)$MID Boost 1092, $P_n(A)$ Terminal 1093 and Battle Damage Assessment 1094, where values may be included.

FIG. 11 illustrates the computational level 4 assessment 1100 according to an embodiment. In FIG. 11 the terminal phase probability of negation, $P_n(A)$ 1110, is computed. $P_n$ for the Terminal Phase is calculated by combining the $P_n$ values related to each of five AMD Layers. The AMD Layers equate to the timing of missile launch operations and include both left-of-launch and right-of-launch time elements. The five AMD Layers include the manufacturing/production/test phases, the fielding/deployment phases, the boost phase, the mid-course phase, and the terminal phase. $P_n$ is calculated for each layer and then combined in the Level 4 calculation. $P_n(A)$ for Level 4 is calculated using a Bayesian conditional calculation.

$P_n(A)$ (Probability of Impact Failure during the Terminal Phase) is calculated by combining the $P_n(x)$ values of each individual layer. Thus, $P_n(A)$ is the probability of impact failure during the terminal phase, without any intervention. Using Bayes Rule we can modify that estimate based on the following conditions (BCDE).

For example, if $P_n(A)=0.01$ (1% probability missile impact fails if we do nothing) then as the various phases BCDE are affected with exploitable non-kinetic vulnerability techniques, $P_n(A)$ is expected to increase:

$$P_n(A|BCDE)=P_n(ABCDE)/P_n(BCDE).$$

Using factorization and putting "always conditioned-on" events behind the conditioning bar for expressions used $P_n(A|BCDE)$ 1120 may be computed as follows:

$$P_n(A|BCDE)=[P_n(BCDE|A)*P_n(A)]/P_n(BCDE).$$

The formal derivation of the Bayesian theorem for $P_n(A|BCDE)$ is provided below:

$$P_n(A | X_B, X_C, X_D, X_E) = \frac{P_n(A)\prod_{i=B}^{E} P_n(X_i | A)}{P(A)\prod_{i=B}^{E} P(X_i | A) + P(\overline{A})\prod_{i=B}^{E} P(X_i | \overline{A})},$$

$$P_n(A)\Pi_{i=B}^{E}P_n(X_i|A)+P_n(\overline{A})\Pi_{i=B}^{E}P_n(X_i|\overline{A}),$$

$$\Pi_{i=B}^{E}P_n(X_i|A)=P_n(A)[P_n(B|A)+P_n(C|A)+P_n(D|A)+P_n(E|A)],$$

$$P_n(X_i | A) = \frac{P_n(X_i) + P_n(A | X_i)}{P_n(B)*P_n(A | B) + P_n(C)*P_n(A | C) + P_n(D)*P_n(A | D) + P_n(E)*P_n(A | E)},$$

$$P_n(\overline{A})\Pi_{i=B}^{E}P_n(X_i|\overline{A})=(P_n(\overline{A})|P_n(B|\overline{A}))+P_n(C|\overline{A})+P_n(D|\overline{A})+P_n(E|\overline{A}),$$

$$P_n(A | BCDE) = \frac{P_n(A)*P_n(BCDE | A)}{P_n(BCDE)}, \text{ where}$$

A is the independent variable and B, C, D and E are the dependent conditional variables, where B, C, D, and E are independent of one another, $\Pi_{i=k}^{n}X_i$ is the product operator; analogous to the addition operator $\Sigma_{i=k}^{n}X_i$, $X_i$=i (i.e., $X_B$=B, $X_C$=C, $X_D$=D, $X_E$=E, $P_n(X_i|A)$ is the probability of even Xi given event A and $\overline{A}$ is the complimentary event of A (i.e., Heads/Tails; Win/Lose; in this case: Impact Success vs. Impact Failure).

Figure 12:
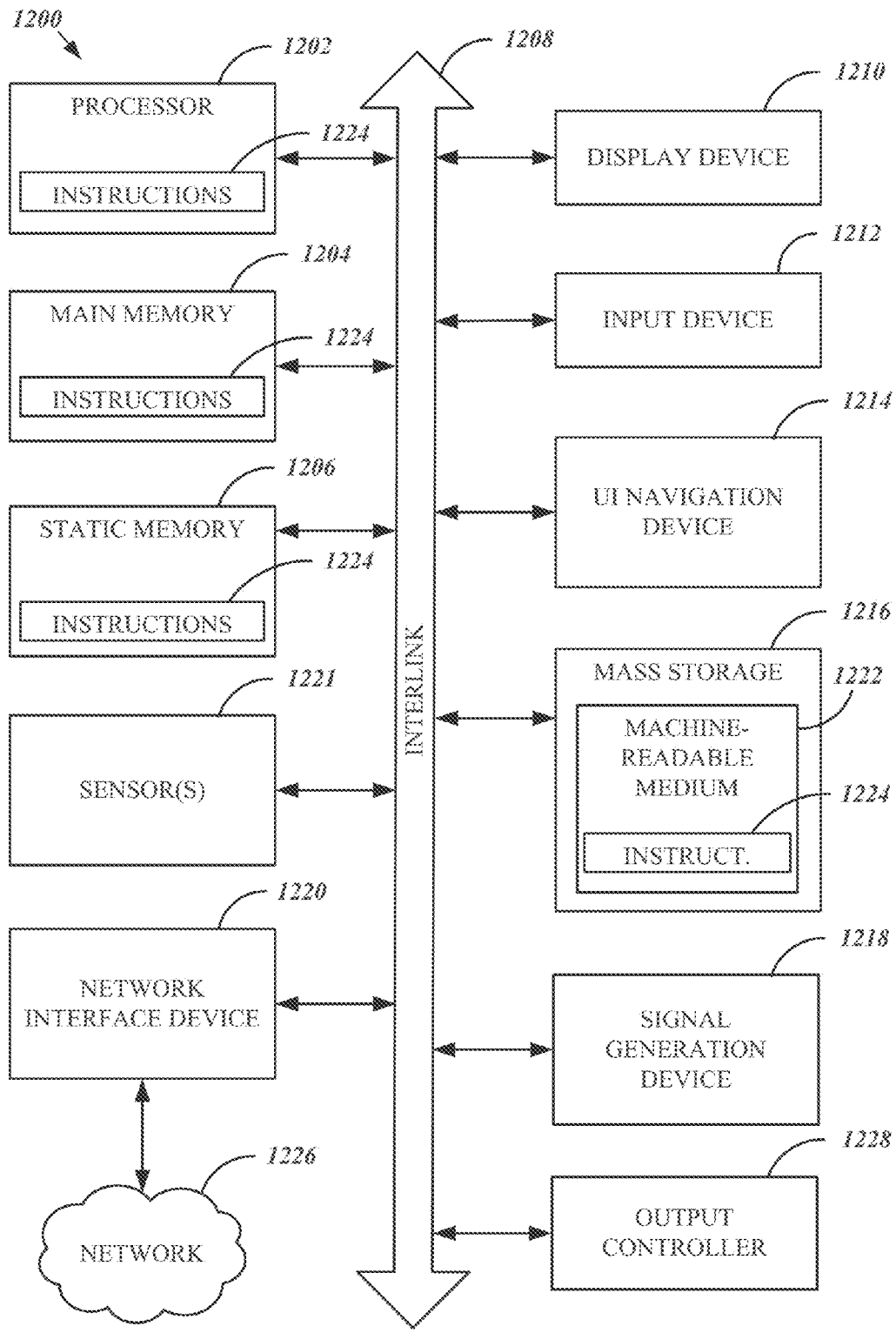
FIG. 12 illustrates a block diagram of an example machine for providing non-kinetic performance assessment according to an embodiment.

FIG. 12 illustrates a block diagram of an example machine 1200 for providing non-kinetic performance assessment according to an embodiment upon which any one or more of the techniques (e.g., methodologies) discussed herein may perform. Furthermore, machine 1200 may present the matrices illustrated herein to a user on a display device 1210 of the machine 1200. However, those skilled in the art will recognize that machine 1210 may be arranged to present instructions, ask for input, etc. in accordance with operation of a machine 1200 for providing non-kinetic performance assessment according to an embodiment.

The machine 1200 may operate as a standalone device or may be connected (e.g., networked) to other machines. In a networked deployment, the machine 1200 may operate in the capacity of a server machine and/or a client machine in server-client network environments. In an example, the machine 1200 may act as a peer machine in peer-to-peer (P2P) (or other distributed) network environment. The machine 1200 may be a personal computer (PC), a tablet PC, a set-top box (STB), a Personal Digital Assistant (PDA), a mobile telephone, a web appliance, a network router, switch or bridge, or any machine capable of executing instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Examples, as described herein, may include, or may operate on, logic or a number of components, modules, or mechanisms. Modules are tangible entities (e.g., hardware) capable of performing specified operations and may be configured or arranged in a certain manner. In an example, circuits may be arranged (e.g., internally or with respect to external entities such as other circuits) in a specified manner as a module. In an example, at least a part of one or more computer systems (e.g., a standalone, client or server computer system) or one or more hardware processors 1202 may be configured by firmware or software (e.g., instructions, an application portion, or an application) as a module that operates to perform specified operations. In an example, the software may reside on at least one machine readable medium. In an example, the software, when executed by the underlying hardware of the module, causes the hardware to perform the specified operations.

Accordingly, the term "module" is understood to encompass a tangible entity, be that an entity that is physically constructed, specifically configured (e.g., hardwired), or temporarily (e.g., transitorily) configured (e.g., programmed) to operate in a specified manner or to perform at least part of any operation described herein. Considering examples in which modules are temporarily configured, a module need not be instantiated at any one moment in time. For example, where the modules comprise a general-purpose hardware processor 1202 configured using software; the general-purpose hardware processor may be configured as respective different modules at different times. Software may accordingly configure a hardware processor, for example, to constitute a particular module at one instance of time and to constitute a different module at a different instance of time. The term "application," or variants thereof, is used expansively herein to include routines, program modules, programs, components, and the like, and may be implemented on various system configurations, including single-processor or multiprocessor systems, microprocessor-based electronics, single-core or multi-core systems, combinations thereof, and the like. Thus, the term application may be used to refer to an embodiment of software or to hardware arranged to perform at least part of any operation described herein.

Machine (e.g., computer system) 1200 may include a hardware processor 1202 (e.g., a central processing unit (CPU), a graphics processing unit (GPU), a hardware processor core, or any combination thereof), a main memory 1204 and a static memory 1206, at least some of which may communicate with others via an interlink (e.g., bus) 1208. The machine 1200 may further include a display unit 1210, an alphanumeric input device 1212 (e.g., a keyboard), and a user interface (UI) navigation device 1214 (e.g., a mouse). In an example, the display unit 1210, input device 1212 and UI navigation device 1214 may be a touch screen display. The machine 1200 may additionally include a storage device (e.g., drive unit) 1216, a signal generation device 1218 (e.g., a speaker), a network interface device 1220, and one or more sensors 1221, such as a global positioning system (GPS) sensor, compass, accelerometer, or other sensor. The machine 1200 may include an output controller 1228, such as a serial (e.g., universal serial bus (USB), parallel, or other wired or wireless (e.g., infrared (IR)) connection to communicate or control one or more peripheral devices (e.g., a printer, card reader, etc.).

The storage device 1216 may include at least one machine readable medium 1222 on which is stored one or more sets of data structures or instructions 1224 (e.g., software) embodying or utilized by any one or more of the techniques or functions described herein. The instructions 1224 may also reside, at least partially, additional machine readable memories such as main memory 1204, static memory 1206, or within the hardware processor 1202 during execution thereof by the machine 1200. In an example, one or any combination of the hardware processor 1202, the main memory 1204, the static memory 1206, or the storage device 1216 may constitute machine readable media.

While the machine readable medium 1222 is illustrated as a single medium, the term "machine readable medium" may include a single medium or multiple media (e.g., a centralized or distributed database, and/or associated caches and servers) that configured to store the one or more instructions 1224.

The term "machine readable medium" may include any medium that is capable of storing, encoding, or carrying instructions for execution by the machine 1200 and that cause the machine 1200 to perform any one or more of the techniques of the present disclosure, or that is capable of storing, encoding or carrying data structures used by or associated with such instructions. Non-limiting machine readable medium examples may include solid-state memories, and optical and magnetic media. Specific examples of machine readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

The instructions 1224 may further be transmitted or received over a communications network 1226 using a transmission medium via the network interface device 1220 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks ((e.g., channel access methods including Code Division Multiple Access (CDMA), Time-division multiple access (TDMA), Frequency-division multiple access (FDMA), and Orthogonal Frequency Division Multiple Access (OFDMA) and cellular networks such as Global System for Mobile Communications (GSM), Universal Mobile Telecommunications System (UMTS), CDMA 2000 1x* standards and Long Term Evolution (LTE)), Plain Old Telephone (POTS) networks, and wireless data networks (e.g., Institute of Electrical and Electronics Engineers (IEEE) 802 family of standards including IEEE 802.11 standards (WiFi), IEEE 802.16 standards (WiMax®) and others), peer-to-peer (P2P) networks, or other protocols now known or later developed.

For example, the network interface device 1220 may include one or more physical jacks (e.g., Ethernet, coaxial, or phone jacks) or one or more antennas to connect to the communications network 1226. In an example, the network interface device 1220 may include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding or carrying instructions for execution by the machine 1200, and includes digital or analog communications signals or other intangible medium to facilitate communication of such software.

The above detailed description includes references to the accompanying drawings, which form a part of the detailed description. The drawings show, by way of illustration, specific embodiments that may be practiced. These embodiments are also referred to herein as "examples." Such examples may include elements in addition to those shown or described. However, also contemplated are examples that include the elements shown or described. Moreover, also contemplate are examples using any combination or permutation of those elements shown or described (or one or more aspects thereof), either with respect to a particular example (or one or more aspects thereof), or with respect to other examples (or one or more aspects thereof) shown or described herein.

Publications, patents, and patent documents referred to in this document are incorporated by reference herein in their entirety, as though individually incorporated by reference. In the event of inconsistent usages between this document and those documents so incorporated by reference, the usage in the incorporated reference(s) are supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to suggest a numerical order for their objects.

The above description is intended to be illustrative, and not restrictive. For example, the above-described examples (or one or more aspects thereof) may be used in combination with others. Other embodiments may be used, such as by one of ordinary skill in the art upon reviewing the above description. The Abstract is to allow the reader to quickly ascertain the nature of the technical disclosure, for example, to comply with 37 C.F.R. §1.72(b) in the United States of America. It is submitted with the understanding that it will not be used to interpret or limit the scope or meaning of the claims. Also, in the above Detailed Description, various features may be grouped together to streamline the disclosure. However, the claims may not set forth features disclosed herein because embodiments may include a subset of said features. Further, embodiments may include fewer features than those disclosed in a particular example. Thus, the following claims are hereby incorporated into the Detailed Description, with a claim standing on its own as a separate embodiment. The scope of the embodiments disclosed herein is to be determined with reference to the appended claims, along with the full scope of equivalents to which such claims are entitled.

What is claimed is:

1. A method for negating a missile threat, comprising:
   identifying, using one or more hardware processors, vulnerabilities of missile threats and non-kinetic techniques for negating the missile threats prior to launch of the missile threats by exploiting the identified vulnerabilities;
   calculating, using one or more of the hardware processors, a probability of negation associated with an effectiveness of each of the identified non-kinetic techniques against each vulnerability prior to launch of the missile threats;
   conditioning the calculated probability of negation of each non-kinetic technique against each vulnerability at a plurality of times associated with a plurality of asymmetric missile defense (AMD) layer elements to produce temporal level probabilities of negation;
   conditioning each of the temporal level probabilities of negation based on a probability of validation of deployment and a probability of verification of mitigation to produce a battle damage assessment probability of negation; calculating a terminal phase probability of impact failure without any kinetic intervention by combining the battle damage assessment probability of negation for each of the plurality of AMD layer elements; and
   negating one or more of the missile threats using the identified non-kinetic techniques in response to determining the terminal phase probability of impact failure without any kinetic intervention is greater than a specified threshold, wherein one or more of the non-kinetic techniques includes using two or more cyber technologies, wherein the two or more cyber technologies include a first cyber technology during a production and test phase of the missile threats, and a second cyber technology during a boost, mid-course, or terminal phase of the missile threats, the first cyber technology including affecting a network associated with a launch of a first missile threat of the missile threats to induce a material defect in the first missile threat, and the second cyber technology including (a) at least one of airborne jamming to degrade a communication uplink, initiate self-destruct, or disrupt a guidance system of a second missile threat of the missile threats and (b) deploying a decoy payload to simulate a radar return from a target of the second missile threat.

2. The method of claim 1, wherein the calculating the probability of negation associated with the effectiveness of each technique against each vulnerability comprises calculating a probability of negation that specific kinetic and non-kinetic techniques will overcome identified vulnerabilities.

3. The method of claim 1, wherein the calculating the probability of negation associated with the effectiveness of each of the techniques against each vulnerability comprises combining data from subject matter experts via a rule-based value derivation process.

4. The method of claim 1, wherein the calculating the probability of negation associated with the effectiveness of each of the techniques against each vulnerability comprises performing failure modes effective analysis including analysis of components for each vulnerability, functions, operational modes, failure modes and causes, failure effects, severities and detection methods.

5. The method of claim 1, wherein the producing temporal level probabilities of negation comprises deriving a probability distribution function from the probability of negation associated with an effectiveness of each of the techniques against each vulnerability and deriving a confidence level for each probability distribution function.

6. The method of claim 5, wherein the producing temporal level probabilities of negation further comprises generating a matrix of temporal level probabilities of negation for the vulnerabilities and techniques.

7. The method of claim 6, wherein the generating the matrix further comprises generating a matrix having an x-axis and a y-axis, wherein the x-axis of the matrix is associated with the vulnerabilities with values related to operations, equipment, and facilities of a threat and the y-axis of the matrix is associated with techniques for exploiting the vulnerabilities to cause a failure of the threat to prevent a successful attack.

8. The method of claim 1, wherein the producing the temporal level probabilities of negation comprises calculating temporal level probabilities of negation for time sub-elements for each of the plurality of AMD layer elements.

9. The method of claim 1, wherein the calculating a terminal phase probability of impact failure without any intervention by combining the battle damage assessment probability of negation for each of plurality of AMD layer elements comprises using a Bayesian conditional calculation.

10. The method of claim 1, wherein the producing the battle damage assessment probability of negation comprises multiplying the probability of negation of a specific technique used against a specific vulnerability at a certain time given the probability of validation of deployment validated based on data obtained from intelligence sources by a probability that the technique has been mitigated and is no longer available for use.

11. The method of claim 10, wherein the probability of validation of deployment is validated based on data obtained from intelligence sources comprises a product of the probability that a threat action will occur, the probability that an intelligence source is available when the threat action occurs, the probability that the intelligence source detects the threat action, the probability that data from the intelligence source is timely enough to enable a tactical response to the threat action.

12. The method of claim 1, wherein the calculating the terminal phase probability of impact failure without any intervention by combining the battle damage assessment probability of negation for each of plurality of AMD layer elements further comprises combining the battle damage assessment probability of negation for the production and test phase, a fielding and deployment phase, the boost phase and the mid-course phase, and the terminal phase.

13. The method of claim 12, wherein the calculating the terminal phase probability of impact failure without any intervention comprises calculating the terminal phase probability of impact failure without any intervention using a Bayesian conditional calculation to modify estimates based on conditions from the production and test phase, the fielding and deployment phase, the boost phase and the mid-course phase.

14. An apparatus for negating a missile threat, the apparatus comprising:
   memory for storing data; and
   one or more processors, coupled to the memory, the one or more processors arranged to:
   calculate a probability of negation of one or more missile threats using one or more non-kinetic techniques, the probability based on an effectiveness of each of the non-kinetic techniques against identified vulnerabilities of the one or more missile threats prior to launch by exploiting one or more of the identified vulnerabilities,
   condition the calculated probability of negation of each non-kinetic technique against each vulnerability of the vulnerabilities at a plurality of times associated with a plurality of asymmetric missile defense (AMD) layer elements to produce temporal level probabilities of negation,
   condition each of the temporal level probabilities of negation based on a probability of validation of deployment and a probability of verification of mitigation to produce a battle damage assessment probability of negation and calculate a terminal phase probability of impact failure without any intervention by combining the battle damage assessment probability of negation for each of plurality of AMD layer elements, and
   the processor further arranged to negate the missile threat using the identified non-kinetic techniques in response to determining the terminal phase probability of impact failure without any kinetic intervention is greater than a specified threshold, wherein one or more of the non-kinetic techniques includes using two or more cyber technologies, wherein the two or more cyber technologies include a first cyber technology during a production and test phase of the missile threats, and a second cyber technology during a boost, mid-course, or terminal phase of the missile threats, the first cyber technology including affecting a network associated with a launch of a first missile threat of the missile threats to induce a material defect in the first missile threat, and the second cyber technology including (a) at least one of airborne jamming to degrade a communication uplink, initiate self-destruct, or disrupt a guidance system of a second missile threat of the missile threats and (b) deploying a decoy payload to simulate a radar return from a target of the second missile threat.

15. The apparatus of claim 14, wherein the processor calculates the probability of negation associated with the effectiveness of each of the techniques against each vulnerability by calculating a probability of negation that specific kinetic and non-kinetic techniques will overcome identified vulnerabilities.

16. The apparatus of claim 14, wherein the processor calculates the probability of negation associated with the effectiveness of each of the techniques against each vulnerability by performing failure triodes effective analysis including analysis of components for each vulnerability, functions, operational modes, failure modes and causes, failure effects, severities and detection methods, wherein the processor produces temporal level probabilities of negation by deriving a probability distribution function from the probability of negation associated with an effectiveness of each of the techniques against each vulnerability and deriving a confidence level for each probability distribution function, wherein the processor produces temporal level probabilities of negation by generating a matrix of temporal level probabilities of negation for the vulnerabilities and techniques.

17. The apparatus of claim 16, wherein the processor generates the matrix by generating a matrix having an x-axis and a y-axis, wherein the x-axis of the matrix is associated with the vulnerabilities with values related to the operations, equipment, and facilities of a threat and the y-axis of the matrix is associated with techniques for exploiting the vulnerabilities to cause a failure of the threat to prevent a successful attack.

18. The apparatus of claim 14, wherein the processor is arranged to produce the temporal level probabilities of negation by calculating temporal level probabilities of negation for time sub-elements for each of the plurality of AMD layer elements, to calculate the terminal phase probability of impact failure without any intervention by combining the battle damage assessment probability of negation for each of plurality of AMD layers by using a Bayesian conditional calculation and to produce the battle damage assessment probability of negation by multiplying the probability of negation of a specific technique used against a specific vulnerability at a certain time given the probability of validation of deployment validated based on data obtained from intelligence sources by a probability that the technique has been mitigated and is no longer available for use.

19. The apparatus of claim 18, wherein the processor is arranged to validate the probability of validation of deployment based on data obtained from intelligence sources by obtaining a product of the probability that a threat action will occur, the probability that an intelligence source is available when the threat action occurs, the probability that the intelligence source detects the threat action, the probability that data from the intelligence source is timely enough to enable a tactical response to the threat action.

20. The apparatus of claim 14, wherein the processor is arranged to calculate the terminal phase probability of impact failure without any intervention by combining the battle damage assessment probability of negation for each of plurality of AMD layer elements and by combining the battle damage assessment probability of negation for the production and test phase, a fielding and deployment phase, the boost phase and the mid-course phase, and the terminal phase.

21. The apparatus of claim 14, wherein the processor is arranged to calculate the terminal phase probability of impact failure without any intervention by calculating the terminal phase probability of impact failure without any intervention using a Bayesian conditional calculation to modify estimates based on conditions from the production and test phases, a fielding and deployment phase, and the boost phase and a mid-course phase.

* * * * *

UNITED STATES PATENT AND TRADEMARK OFFICE
CERTIFICATE OF CORRECTION

PATENT NO. : 9,779,191 B1
APPLICATION NO. : 14/185029
DATED : October 3, 2017
INVENTOR(S) : Hershey et al.

Page 1 of 1

It is certified that error appears in the above-identified patent and that said Letters Patent is hereby corrected as shown below:

On the Title Page

On page 2, in Column 2, under "Other Publications", Line 1, delete "Mell." and insert --Mell,-- therefor In the Drawings Sheet 8 of 12, Fig. 8, reference numeral 840, Line 1, delete "Acqquisition" and insert --Acquisition-- therefor On sheet 8 of 12, Fig. 8, reference numeral 850, Line 1, delete "Acqquisition" and insert --Acquisition-- therefor On sheet 8 of 12, Fig. 8, reference numeral 860, Line 1, delete "Acqquisition" and insert --Acquisition-- therefor On sheet 8 of 12, Fig. 8, reference numeral 870, Line 1, delete "Acqquisition" and insert --Acquisition-- therefor In the Specification In Column 6, Line 38, delete "($P_{vin}$)." and insert --($P_{vm}$).-- therefor In Column 15, Line 66, delete "1210" and insert --1200-- therefor In the Claims In Column 21, Line 36, in Claim 14, before "negate", delete "the processor further arranged to"

In Column 22, Line 1, in Claim 16, delete "triodes" and insert --modes-- therefor Signed and Sealed this
Ninth Day of July, 2019

Andrei Iancu
*Director of the United States Patent and Trademark Office*